(12) United States Patent
Lee et al.

(10) Patent No.: US 10,211,220 B2
(45) Date of Patent: Feb. 19, 2019

(54) SEMICONDUCTOR DEVICE

(71) Applicant: Samsung Electronics Co., Ltd., Suwon-si (KR)

(72) Inventors: Byoung Il Lee, Seoul (KR); Kyung Jun Shin, Seoul (KR); Dong Seog Eun, Seongnam-si (KR); Ji Hye Kim, Anyang-si (KR); Hyun Kook Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/688,011

(22) Filed: Aug. 28, 2017

(65) Prior Publication Data
US 2017/0358597 A1 Dec. 14, 2017

Related U.S. Application Data

(63) Continuation of application No. 15/390,977, filed on Dec. 27, 2016, now Pat. No. 9,773,806.

(30) Foreign Application Priority Data

May 4, 2016 (KR) ........................ 10-2016-0055405

(51) Int. Cl.
| | |
|---|---|
| *H01L 27/115* | (2017.01) |
| *H01L 27/11582* | (2017.01) |
| *G11C 16/04* | (2006.01) |
| *H01L 27/1157* | (2017.01) |
| *H01L 21/8239* | (2006.01) |
| *H01L 21/8238* | (2006.01) |
| *H01L 27/11568* | (2017.01) |

(52) U.S. Cl.
CPC .... *H01L 27/11582* (2013.01); *G11C 16/0466* (2013.01); *H01L 27/1157* (2013.01); *G11C 16/0483* (2013.01); *H01L 21/8239* (2013.01); *H01L 21/823885* (2013.01); *H01L 27/11568* (2013.01)

(58) Field of Classification Search
CPC ....... H01L 27/11568; H01L 21/823885; H01L 21/8239
USPC ....................................................... 257/329
See application file for complete search history.

(56) References Cited

U.S. PATENT DOCUMENTS

| | | |
|---|---|---|
| 6,833,079 B1 | 12/2004 | Giordani |
| 9,054,130 B2 | 6/2015 | Peng et al. |

(Continued)

FOREIGN PATENT DOCUMENTS

| | | |
|---|---|---|
| KR | 0733228 B1 | 6/2007 |
| KR | 2008-0001766 A | 1/2008 |

*Primary Examiner* — George Fourson, III
(74) *Attorney, Agent, or Firm* — Muir Patent Law, PLLC

(57) ABSTRACT

A semiconductor device includes gate electrodes and interlayer insulating layers alternately stacked on a substrate, a channel layer penetrating through the gate electrodes and the interlayer insulating layers, and a gate dielectric layer disposed on an external surface of the channel layer between the gate electrodes and the channel layer. In addition, the channel layer includes a first region extended in a direction perpendicular to a top surface of the substrate and a second region connected to the first region in a lower portion of the first region and including a plane inclined with respect to the top surface of the substrate.

20 Claims, 34 Drawing Sheets

(56) References Cited

U.S. PATENT DOCUMENTS

| | | |
|---|---|---|
| 9,064,736 B2 | 6/2015 | Lee et al. |
| 2012/0068255 A1 | 3/2012 | Lee et al. |
| 2013/0134492 A1 | 5/2013 | Yang et al. |
| 2013/0140623 A1 | 6/2013 | Lee et al. |
| 2013/0270625 A1 | 10/2013 | Jang et al. |
| 2013/0313631 A1 | 11/2013 | Yang et al. |
| 2015/0021695 A1 | 1/2015 | Hu et al. |
| 2015/0115348 A1 | 4/2015 | Nam et al. |
| 2015/0145020 A1 | 5/2015 | Kim et al. |
| 2015/0179661 A1 | 6/2015 | Huo et al. |
| 2015/0200203 A1 | 7/2015 | Jang et al. |
| 2015/0311214 A1 | 10/2015 | Yoo et al. |
| 2015/0311301 A1 | 10/2015 | Seol et al. |
| 2015/0340465 A1 | 11/2015 | Harley et al. |
| 2015/0349088 A1 | 12/2015 | Wei et al. |
| 2016/0005760 A1* | 1/2016 | Lee .................. H01L 27/11582 257/324 |
| 2016/0276365 A1 | 9/2016 | Choi et al. |
| 2017/0098656 A1 | 4/2017 | Son et al. |
| 2017/0103997 A1* | 4/2017 | Lee .................... H01L 21/0243 |

\* cited by examiner

SEMICONDUCTOR DEVICE

CROSS-REFERENCE TO RELATED APPLICATION

This application is a continuation of U.S. patent application Ser. No. 15/390,977, filed Dec. 27, 2016, in the U.S. Patent and Trademark Office, which claims benefit of priority under 35 U.S.C. § 119 to Korean Patent Application No. 10-2016-0055405, filed on May 4, 2016, in the Korean Intellectual Property Office, the disclosures of both of which are incorporated herein by reference in their entireties.

BACKGROUND

1. Field

The present concepts relate to a semiconductor device.

2. Description of Related Art

Although the size of electronic products has gradually decreased, there remains a continued demand for high-capacity data processing. Therefore, there is a demand for an increased degree of integration of semiconductor devices used in electronic products. To increase the degree of integration of semiconductor devices, semiconductor devices having a vertical transistor structure, instead of having a prior art planar transistor structure, have been developed.

SUMMARY

An aspect of the present inventive concept may provide a semiconductor device including transistors having improved properties, configuring a memory cell string, in such a manner that a disconnection phenomenon in a lower portion of a channel layer is resolved, and a thickness of the channel layer is reduced.

According to an aspect, the present disclosure is directed to a semiconductor device comprising: gate electrodes and interlayer insulating layers alternately stacked on a substrate; a channel layer penetrating through the gate electrodes and the interlayer insulating layers; and a gate dielectric layer disposed on an external surface of the channel layer between the gate electrodes and the channel layer, wherein the channel layer includes a first region extended in a direction perpendicular to a top surface of the substrate and a second region connected to the first region in a lower portion of the first region and having planes inclined with respect to the top surface of the substrate, and wherein the second region extends below the gate dielectric layer.

According to another aspect, the present disclosure is directed to a semiconductor device comprising: conductive layers and interlayer insulating layers alternately stacked on a substrate; a channel layer penetrating through the conductive layers and the interlayer insulating layers to be extended in a direction perpendicular to the substrate; and a gate dielectric layer disposed between the conductive layers and the channel layer, wherein at least one portion of the channel layer includes a plurality of inclined planes having a width narrowed in a direction toward the substrate.

According to another aspect, the present disclosure is directed to a method of manufacturing a semiconductor device comprising: alternately stacking interlayer insulating layers and sacrificial layers on a substrate; forming channel holes penetrating through the interlayer insulating layers and the sacrificial layers to form at least a first recessed region on the substrate; forming an epitaxial layer on the first recessed region of the substrate; forming a gate dielectric layer covering a side wall of the channel holes and a top surface of the epitaxial layer; forming a sacrificial spacer layer on the gate dielectric layer; removing a portion of the gate dielectric layer disposed on the top surface of the epitaxial layer using the sacrificial spacer layer; forming at least a second recessed region having a plurality of inclined planes and extended below of the gate dielectric layer in an upper portion of the epitaxial layer while the sacrificial spacer layer is removed; and forming a channel layer on the gate dielectric layer to allow the second recessed region to be filled.

BRIEF DESCRIPTION OF DRAWINGS

The above and other aspects, features and other advantages of the disclosed embodiments will be more clearly understood from the following detailed description taken in conjunction with the accompanying drawings, in which.

DETAILED DESCRIPTION

Hereinafter, embodiments will be described as follows with reference to the attached drawings. In a description of example embodiments, a Miller index is used in notation describing crystallographic planes and directions.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

It will be understood that when an element is referred to as being "connected" or "coupled" to, "in contact with," or "on" another element, it can be directly connected or coupled to, in contact with, or on the other element or intervening elements may be present. In contrast, when an element is referred to as being "directly connected," "directly coupled," in "direct contact with," or "directly on" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 1:
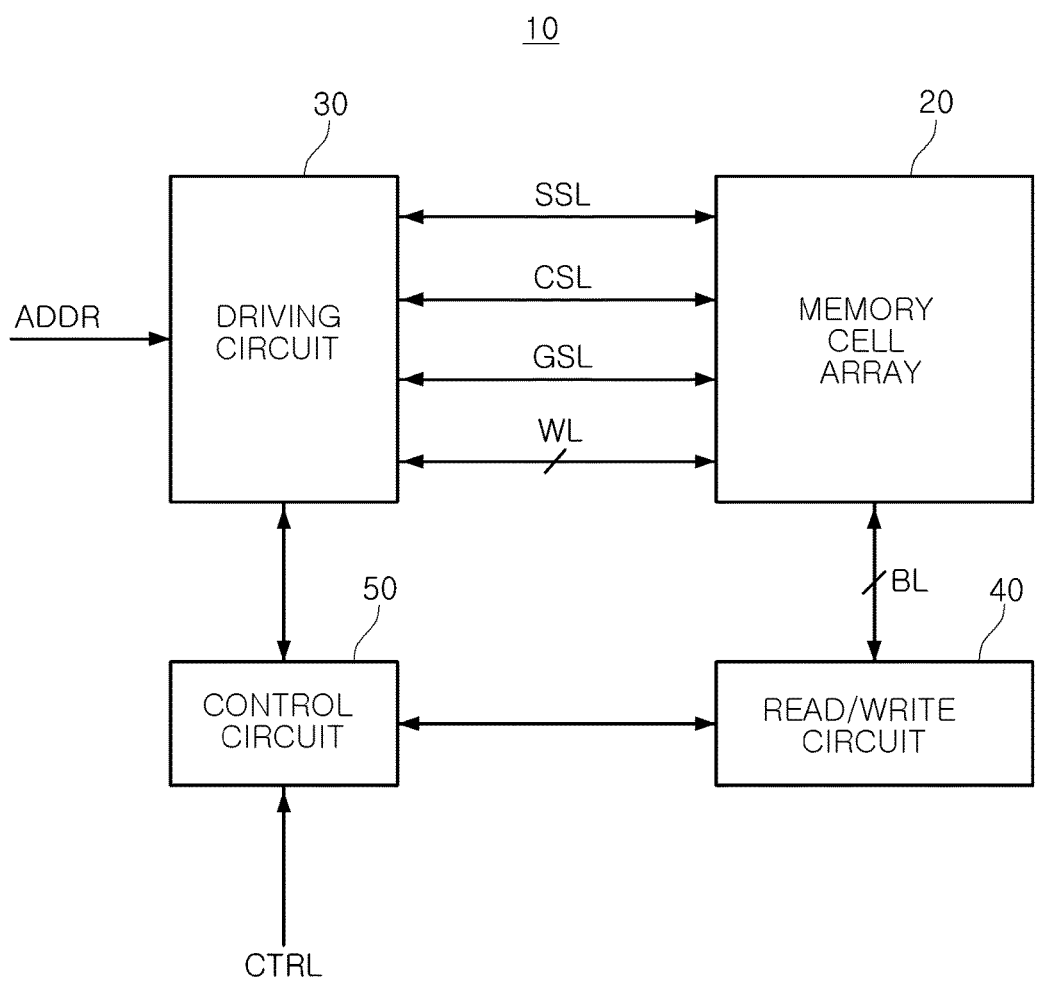
FIG. 1 is a schematic block diagram of a semiconductor device according to an example embodiment t.

FIG. 1 is a schematic block diagram of a semiconductor device according to an example embodiment.

With reference to FIG. 1, a semiconductor device 10 according to an example embodiment may include a memory cell array 20, a driving circuit 30, a read/write circuit 40, and a control circuit 50.

The memory cell array 20 may include a plurality of memory cells, and the plurality of memory cells may be arranged in a plurality of rows and columns. The plurality of memory cells included in the memory cell array 20 may be connected to the driving circuit 30 through a word line (WL), a common source line (CSL), a string select line (SSL), a ground select line (GSL), or the like, and may be connected to the read/write circuit 40 through a bit line (BL). According to an example embodiment, each of the plurality of memory cells may be connected to one WL and one BL. The memory cells arranged in the same row may be connected to the same WL, while the memory cells arranged in the same column may be connected to the same BL.

The plurality of memory cells included in the memory cell array 20 may be divided into a plurality of memory blocks. Each memory block may include a plurality of WLs, a plurality of SSLs, a plurality of GSLs, a plurality of BLs, and at least one CSL.

The driving circuit 30 and the read/write circuit 40 may be undertaken by the control circuit 50. According to an example embodiment, the driving circuit 30 may receive address information from an external source and instructions to decode the received address information, and the driving circuit 30 may selecting at least one portion of the WL, the CSL, the SSL, and the GSL, connected to the memory cell array 20. The driving circuit 30 may include a driving circuit corresponding to each of the WL, the SSL, and the CSL.

The read/write circuit 40 may select at least one portion of the BLs connected to the memory cell array 20 according to a command received by the control circuit 50. The read/write circuit 40 may read data stored in a memory cell connected to the at least one selected portion of the BLs or may record or store data in the memory cell connected to the at least one selected portion of the BLs. In order to perform operations, including those described above, the read/write circuit 40 may include a circuit, such as a page buffer, an input/output buffer, a data latch, and the like.

The control circuit 50 may control an operation of the driving circuit 30 and the read/write circuit 40 in response to a control signal CTRL transmitted from the external source. In a case in which data stored in the memory cell array 20 is read, the control circuit 50 may control the operation of the driving circuit 30 to allow a voltage required for a read operation to be supplied to the WL connected to the memory cell storing data to read the stored data. In a case in which the voltage required for a read operation is supplied to a specific WL, the control circuit 50 may control the read/write circuit 40 to allow the read/write circuit 40 to read data stored in the memory cell connected to the specific WL receiving the voltage for a read operation.

In an embodiment in which data is written in the memory cell array 20, the control circuit 50 may control the operation of the driving circuit 30 to allow a voltage required for a write operation to be supplied to the WL connected to the memory cell to write data to the memory cell. In an embodiment in which the voltage required for a write operation is supplied to a specific WL, the control circuit 50 may control the read/write circuit 40 to allow data to be written in the memory cell connected to the specific WL receiving the voltage required for a write operation.

Figure 2:
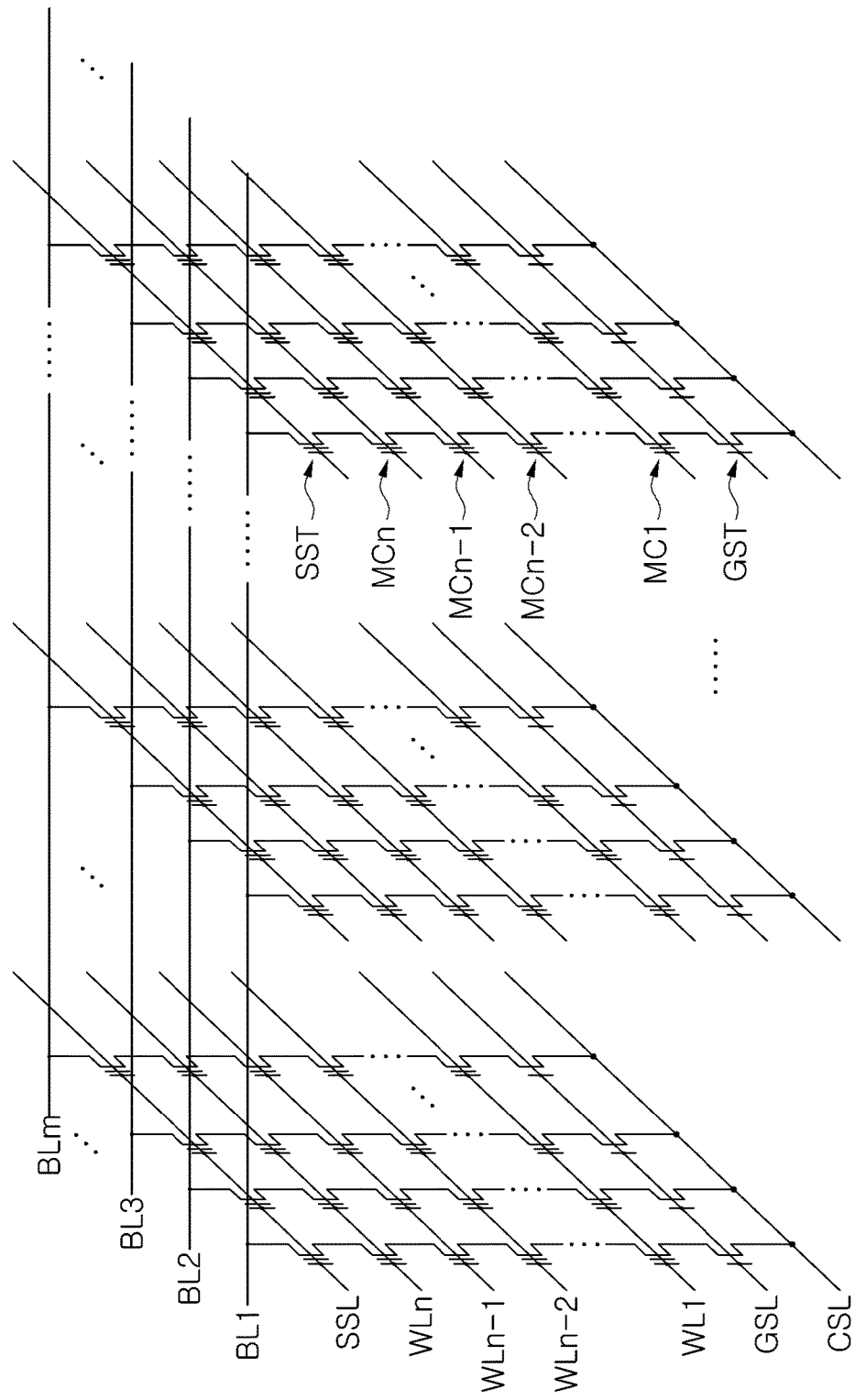
FIG. 2 is an equivalent circuit diagram of a memory cell array of a semiconductor device according to an example embodiment.

FIG. 2 is an equivalent circuit diagram of an exemplary memory cell array of a semiconductor device according to an example embodiment.

FIG. 2 illustrates a three-dimensional structure of the memory cell array included in a semiconductor device having a vertical structure, such as, for example, semiconductor device 100. With reference to FIG. 2, the memory cell array according to the example embodiment may include n memory cell transistors MC1 to MCn connected in series, ground select transistor (GST) connected to opposing ends of the memory cell transistors MC1 to MCn connected in series, and a plurality of memory cell strings each including a string select transistor (SST).

The n memory cell transistors MC1 to MCn connected in series may be connected to n WLs WL1 to WLn, respectively, to select at least one portion of the memory cell transistors MC1 to MCn.

A gate terminal of the GST may be connected to a GSL, while a source terminal may be connected to a CSL. In the meantime, a gate terminal of the SST may be connected to an SSL, while the source terminal may be connected to a drain terminal of a memory cell transistor MCn. FIG. 2 illustrates a structure in which a single GST and a single SST are connected to n memory cell transistors MC1 to MCn connected in series. Alternatively, however, a plurality of GSTs or a plurality of SSTs may be connected to n memory cell transistors MC1 to MCn connected in series.

A drain terminal of the SST may be connected to m BLs BL1 to BLm. In a case in which a signal is applied to the gate terminal of the SST through the SSL, a signal applied through the BLs BL1 to BLm may be transmitted to n memory cell transistors MC1 to MCn connected in series, so that a data read operation or a data write operation may be undertaken.

Figure 3:
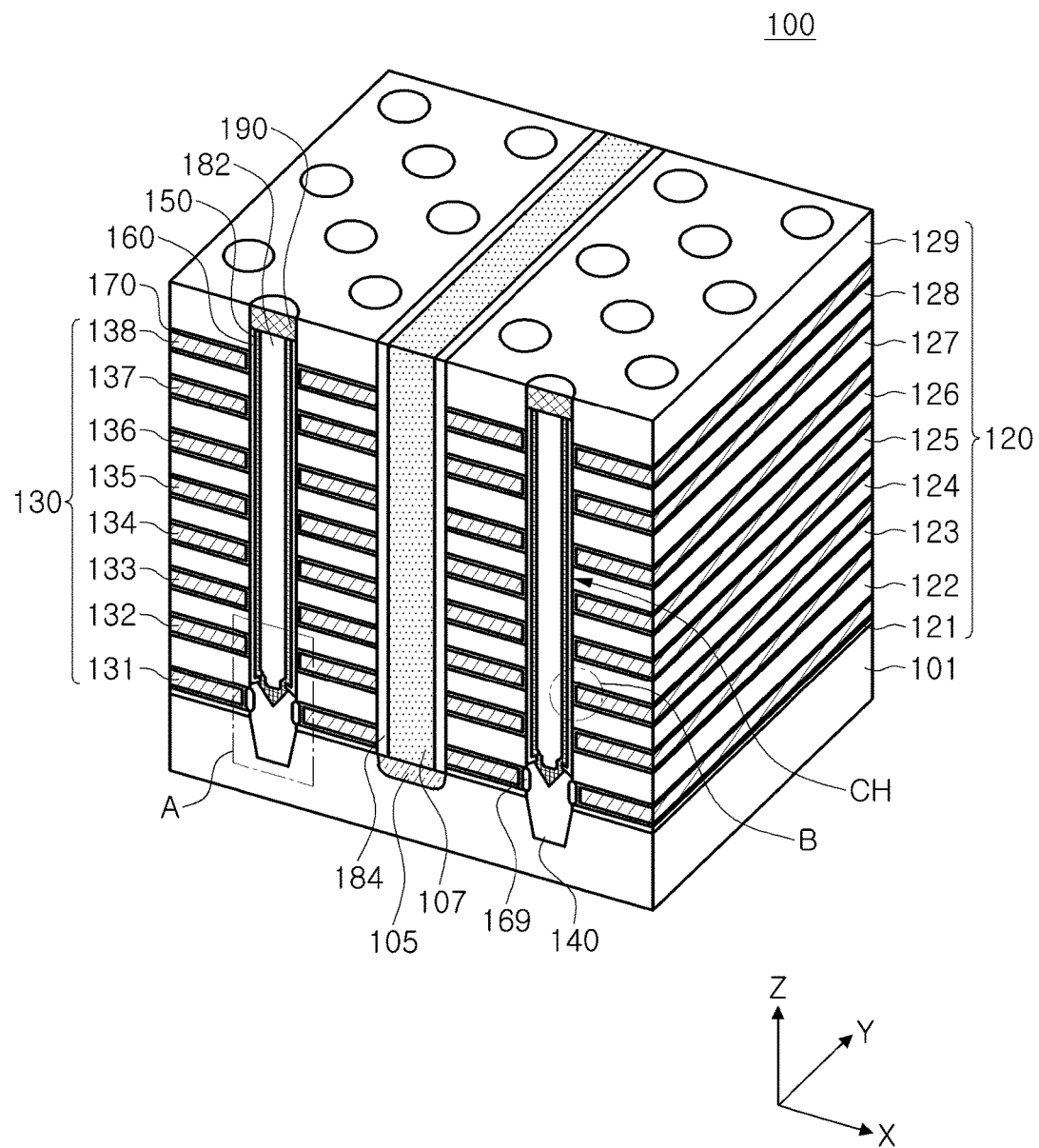
FIG. 3 is a schematic perspective view illustrating a structure of memory cell strings of a semiconductor device according to an example embodiment.
Figure 4:
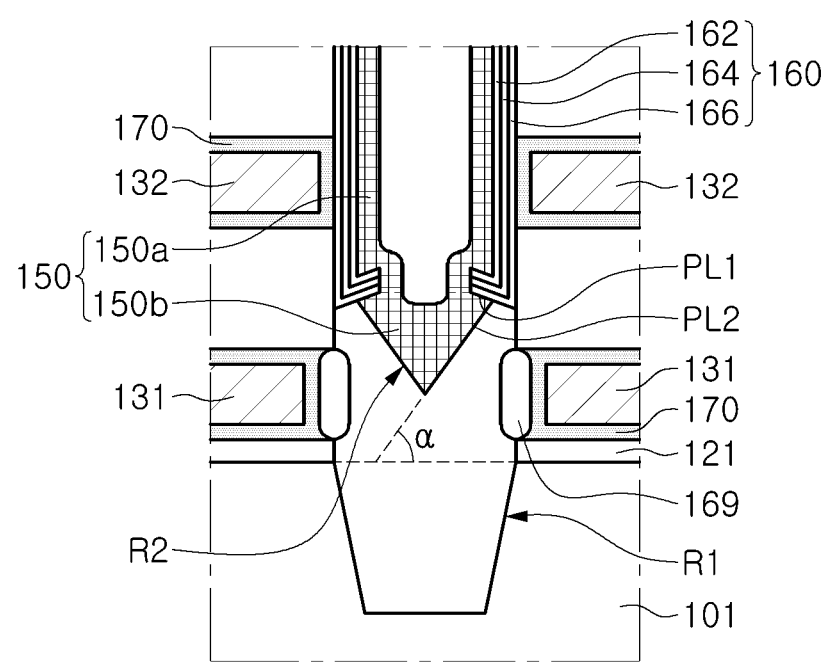
FIGS. 4 and 5 are cross-sectional views illustrating a channel layer according to an example embodiment, and a region corresponding to region 'A' in FIG. 3 is illustrated therein.

FIG. 3 is a schematic perspective view illustrating a structure of memory cell strings of a semiconductor device according to an example embodiment. FIG. 4 is a cross-sectional view illustrating a channel layer according to an example embodiment, and a region corresponding to region 'A' in FIG. 3 is illustrated therein.

With reference to FIGS. 3 and 4, a semiconductor device 100 may include a substrate 101, channel holes CH extended in a direction perpendicular to a top surface of the substrate 101, channel layers 150 disposed in the channel holes CH, and interlayer insulating layers 120 and gate electrodes 130, stacked along a side wall of the channel holes CH. In addition, the semiconductor device 100 may further include epitaxial layers 140 disposed between the channel layers 150 and the substrate 101, gate dielectric layer 160 disposed between the channel layers 150 and the gate electrodes 130, an impurity region 105 disposed in the substrate 101 between the gate electrodes 130, a conductive layer 107 disposed on the impurity region 105, and conductive pads 190 disposed in an upper portion of the channel layers 150.

In the semiconductor device 100, a single memory cell string may be formed based on a single channel layer 150. The semiconductor device 100 may include a plurality of memory cell strings disposed in columns and rows in X and Y directions.

The substrate 101 may include the top surface extended in the X and Y directions. The substrate 101 may include a semiconductor material, such as a group IV semiconductor, a group III-V compound semiconductor or a group II-VI compound semiconductor. For example, the group IV semiconductor may include silicon (Si), germanium (Ge), or silicon-germanium (SiGe). The substrate 101 may be provided as a bulk wafer or an epitaxial layer.

The gate electrodes 130 (e.g., gate electrodes 131 to 138) and the interlayer insulating layers 120 (e.g., interlayer insulating layers 121 to 129) may be alternately stacked on the substrate 101. For example, interlayer insulating layer 129 may be stacked on gate electrode 138, which may be stacked on interlayer insulating layer 128, which may be stacked on gate electrode 137, which may be stacked on interlayer insulating layer 127, and so on.

The gate electrodes 130 (e.g., gate electrodes 131 to 138) may be disposed to be spaced apart from each other in a Z direction, extending from the substrate 101, along a side surface of respective channel layers 150. With reference to FIG. 2, respective gate electrodes 130 may be provided as a gate of a GST, memory cell transistors MC1 to MCn, and an SST. A gate electrode 130 may be extended to form WLs WL1 to WLn.

FIG. 3 illustrates an example in which five gate electrodes 132 to 136 of the memory cell transistors MC1 to MCn are disposed. In some embodiments, five gate electrodes 132 to 136 may correspond to five memory cell transistors MC1 to MC5. However, the embodiments are not limited thereto. Depending on a capacity of the semiconductor device 100, the number of the gate electrodes 130 forming the memory cell transistors MC1 to MCn may be determined, and may vary. For example, the number of the gate electrodes 130 forming the memory cell transistors MC1 to MCn may be 30 or more. In some embodiments, for example, 30 gate electrodes 130 may form 30 memory cell transistors MC1 to MC30.

A gate electrode 131 of the GST may be extended in a Y direction to form a GSL. In order to operate the GST, a predetermined impurity may be doped in the substrate 101 below the gate electrode 131. Gate electrodes 137 and 138 of the SST may be extended in the Y direction to form an SSL. In addition, a portion of the gate electrodes 130 may be provided as a dummy gate electrode. For example, the gate electrode 130 adjacent to the gate electrode 131 of the GST (e.g., gate electrode 132) or the gate electrodes 130 disposed adjacent to the gate electrodes 137 and 138 of the SST (e.g., gate electrode 135 or gate electrode 136) may be provided as a dummy gate electrode.

The gate electrodes 130 may include a metal, such as tungsten (W). In addition, a diffusion barrier 170 may be disposed to substantially surround the gate electrodes 130. For example, the diffusion barrier 170 may include at least one of a tungsten nitride (WN), a tantalum nitride (TaN), and a titanium nitride (TiN). In an example embodiment, the gate electrodes 130 may include polycrystalline silicon or a metal silicide material. For example, the metal silicide material may be provided as a silicide material including a metal selected from cobalt (Co), nickel (Ni), hafnium (Hf), platinum (Pt), W, and titanium (Ti).

The interlayer insulating layers 120 (e.g., interlayer insulating layers 121 to 129) may be alternately disposed between the gate electrodes 130. For example, interlayer insulating layer 129 may be stacked on gate electrode 138, which may be stacked on interlayer insulating layer 128, which may be stacked on gate electrode 137, which may be stacked on interlayer insulating layer 127, and so on. In a manner the same as that of the gate electrodes 130, the interlayer insulating layers 120 may be disposed to be spaced apart from each other in a Z direction and to be extended in the Y direction. The interlayer insulating layers 120 may include an insulating material, such as a silicon oxide or a silicon nitride.

The gate dielectric layer 160 may be disposed between the gate electrodes 130 and the channel layers 150. As illustrated in FIG. 4, a bottom portion of the gate dielectric layer 160 may include an L-shaped cross section. For example, the bottom portion of the gate dielectric layer 160 may be formed at an angle relative to other portions of the gate dielectric layer 160. Although FIG. 4 illustrates the bottom portion of the gate dielectric layer 160 formed at an acute angle, the bottom portion of the gate dielectric layer 160 may be formed at an obtuse angle or a right angle relative to other portions of the gate dielectric layer 160. The gate dielectric layer 160 may include a tunneling layer 162, a charge storage layer 164, and a blocking layer 166, stacked on the channel layers 150 in sequence. For example, the tunneling layer 162 may be formed on an outside surface of the channel layers 150, the charge storage layer 164 may be formed on an outside surface of the tunneling layer 162, and the blocking layer 166 may be formed on an outside surface of the charge storage layer 164. The gate dielectric layer 160 in the example embodiment may be disposed in such a manner that an entirety of the tunneling layer 162, the charge storage layer 164, and the blocking layer 166 may be extended in a vertical direction (e.g., a Z-direction) along the channel layer 150. A thickness of the layers configuring the gate dielectric layer 160 is not limited to the thickness illustrated in an example embodiment, but may be variously changed.

The tunneling layer 162 may allow a charge (for example, an electron) to tunnel to the charge storage layer 164 using the Fowler-Nordheim (F-N) mechanism. For example, the tunneling layer 162 may include the silicon oxide. The charge storage layer 164 may be provided as a charge trapping layer or a floating gate conductive layer. For example, the charge storage layer 164 may include an insulating layer including a quantum dot or a nanocrystal. In this case, the quantum dot or the nanocrystal may include a conductive material, such as fine particles of a metal or a semiconductor. For example, the charge storage layer 164 may be provided as the charge trapping layer including the silicon nitride.

The blocking layer 166 may include a silicon oxide ($SiO_2$) a silicon nitride ($Si_3N_4$), a silicon oxynitride (SiON), a high-k dielectric material or a combination thereof. The high-k dielectric material may be provided as one of an aluminum oxide ($Al_2O_3$), a tantalum oxide ($Ta_2O_3$), titanium dioxide ($TiO_2$), an yttrium oxide ($Y_2O_3$), zirconium dioxide ($ZrO_2$), a zirconium silicate ($ZrSi_xO_y$), a hafnium oxide ($HfO_2$), a hafnium silicate ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$).

The channel layers 150 may penetrate through the gate electrodes 130 and the interlayer insulating layers 120 to be extended in a direction substantially perpendicular to the top surface of the substrate 101 (e.g., Z direction). In addition, the channel layers 150 may have a form in which a width thereof is reduced in a direction toward the substrate 101, as an aspect ratio (the aspect ratio representing a ratio of the height of an opening to a width of the opening) of the channel hole CH is increased. For example, a width of the channel layers 150 may be smaller in portions nearer to the substrate 101 and wider in portions farther away from the substrate 101 in the Z-direction. The channel layers 150 may be disposed to be spaced apart from each other in the X and Y directions. However, an array of the channel layers 150 may vary according to an example embodiment. For example, the array of the channel layers 150 may be disposed in a zigzag shape in at least one direction. In addition, the array of the channel layers 150 disposed adjacently to each other on opposite sides of the conductive layer 107 may be symmetrical, as illustrated in an example embodiment, but the concept is not limited thereto.

The channel layer 150 may include a semiconductor material, such as polycrystalline silicon and single crystal silicon. In addition, the semiconductor material may be provided as an undoped material or a material including a p-type or an n-type impurity.

Each channel layer 150 may include a vertically-provided portion 150*a* having a pipe shape and extended in a direction perpendicular to the top surface of the substrate 101 (e.g., a Z direction) and a connection portion 150*b* connected to a lower portion or end of the vertically-provided portion. In some embodiments, the connection portion 150*b* may extend across a bottom of the pipe shape of the vertically-provided portion 150*a*. An interior of the channel layer 150 may be filled with a first insulating layer 182.

The connection portion 150*b* may include a first plane PL1 extended below the bottom portion of the gate dielectric layer 160 and a second plane PL2 inclined at a specific angle α with respect to the top surface of the substrate 101 in a direction different from that of the first plane PL1. The connection portion 150*b* may include a plurality of the second planes PL2, while the second planes PL2 may meet each other to form a pointed shape, pointed toward a substrate disposed therebelow. In other words, due to the angle α of the second planes PL2, the connection portion 150*b* may have a width that narrows as the connection portion 150*b* extends in a direction toward the substrate disposed therebelow. In some embodiments, each of the inclined second planes PL2 has a width that narrows in a direction toward the substrate.

The first plane PL1 and the second plane PL2 of the connection portion 150*b* may meet below the bottom portion of the gate dielectric layers 160. In addition, the first plane PL1 may be provided as an interface at which the connection portion 150*b* is in contact with a portion of a bottom surface of the gate dielectric layers 160, and may be formed on the same plane as the bottom surface of the gate dielectric layers 160. In some embodiments, a bottom surface of the blocking layer 166 may be adjacent to and facing the first plane PL1.

For example, in a case in which the substrate 101 is provided as a (100) silicon substrate, an angle α between the second plane PL2 of the connection portion 150*b* and the top surface of the substrate 101 may be substantially the same as the angle between a (100) crystal plane and a (111) crystal plane of a diamond crystal structure.

An epitaxial layer 140 may be disposed between the channel layer 150 and the substrate 101, and may be in contact with the channel layer 150 and the substrate 101. For example, the epitaxial layer 140 may be in contact with the connection portion 150*b* of the channel layer 150. In some embodiments, the epitaxial layer 140 may be disposed below the channel layer 150 and the gate dielectric layers 160. The channel layer 150 may be electrically connected to the substrate 101 through the epitaxial layer 140. The epitaxial layer 140 may be disposed on a recessed region R1 of the substrate 101. The epitaxial layer 140 may fill the recessed region R1, and may be extended above the top surface of the substrate 101. For example, a top surface of the epitaxial layer 140 may be higher than that of the gate electrode 131 disposed in a bottom portion of the gate electrodes 130, and may be lower than a bottom surface of the gate electrode 132. The top surface of the epitaxial layer 140 may include an inclined plane having a convex central portion that narrows to a point as it nears the substrate 101, forming a conically-shaped or pyramidically-shaped recess in the epitaxial layer 140.

An upper portion of the epitaxial layer 140 may include a recessed region R2 in contact with the connection portion 150*b* of the channel layer 150. The second plane PL2 of the connection portion 150*b* may be provided as an interface at which the epitaxial layer 140 is in contact with the channel layer 150. In a manufacturing process, a form of the connection portion 150*b* may be determined by a form of the recessed region R2 formed in the upper portion of the epitaxial layer 140. For example, the shape of the connection portion 150*b* may be the negative or reverse of the shape of the shape of the recessed region R2 formed in the upper portion of the epitaxial layer 140.

Although an aspect ratio of the channel layer 150 is increased as the channel layer nears the substrate 101, the channel layer 150 may be electrically connected to the substrate 101 by the epitaxial layer 140, and properties of the GST may become uniform. The epitaxial layer 140 may be provided as a semiconductor material layer formed using a selective epitaxial growth (SEG) process. The epitaxial layer 140 may include Si, Ge, or SiGe, and may be undoped or doped with an impurity.

An epitaxial insulating layer 169 may be disposed between the epitaxial layer 140 and the gate electrode 131. The epitaxial insulating layer 169 may act as a gate insulating layer of the GST. The epitaxial insulating layer 169 may be provided as an oxide formed in such a manner that a portion of the epitaxial layer 140 is oxidized. For example, the epitaxial insulating layer 169 may be provided as $SiO_2$.

In an upper portion of the memory cell string, a conductive pad 190 may be disposed to cover a top surface of the first insulating layer 182 to be electrically connected to the channel layer 150. For example, the conductive pad 190 may include doped polycrystalline silicon. The conductive pad 190 may act as a drain region of the SST (see FIG. 2). The conductive pad 190 may be electrically connected to the BL through a contact plug.

In a bottom portion of the memory cell string, the impurity region 105, which is arranged in the X direction, may be disposed. The impurity region 105 may be extended in the Y direction, adjacent to the top surface of the substrate 101, and may be disposed to be spaced apart from each other by a predetermined interval in the X direction. For example, the impurity region 105 may be disposed in the substrate 101 and a top surface of the impurity region 105 may be at a same level as a top surface of the substrate 101. The impurity region 105 may act as a source region of the GST (see FIG. 2).

The conductive layer 107 may be disposed on the impurity region 105, and the conductive layer 107 may be disposed to be extended along the impurity region 105 in the Y direction. For example, the conductive layer 107 may extend congruently with the impurity region 105 in the Y direction. The conductive layer 107 may include a conductive material. For example, the conductive layer 107 may include W, aluminum (Al), or copper (Cu). The conductive layer 107 may be electrically isolated from the gate electrodes 130 by second insulating layers 184, and the second insulating layers 184 may insulate the conductive layer 107 from the gate electrodes 130.

Figure 5:
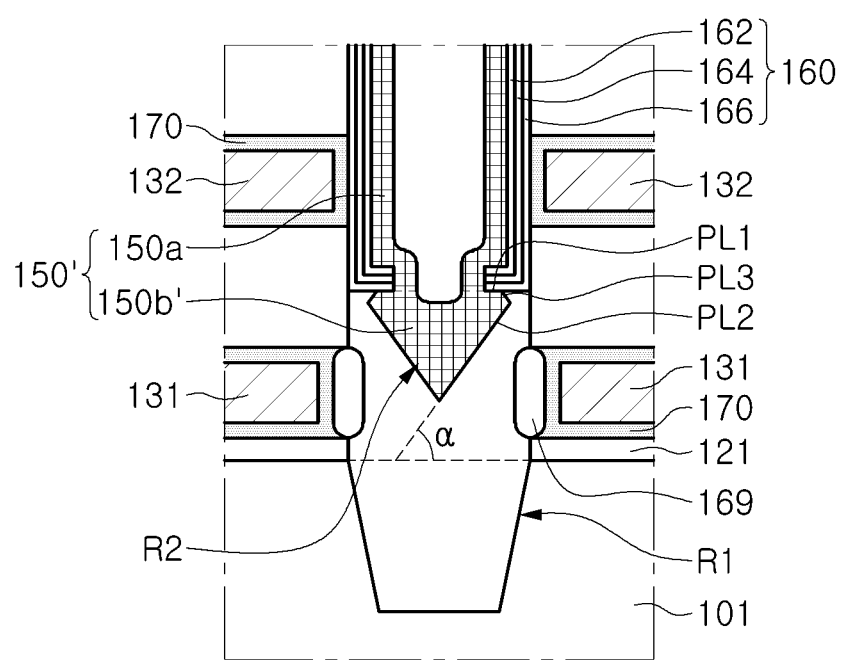

FIG. 5 is a cross-sectional view illustrating a channel layer according to an example embodiment, and a region corresponding to region 'A' in FIG. 3 is illustrated therein. FIG. 5 illustrates a structure in which a form of a connection portion of a channel layer illustrated in FIG. 4 is modified.

With reference to FIG. 5, each channel layer 150' may include a vertically-provided portion 150a having a pipe shape and extended in a direction perpendicular to a top surface of a substrate 101 (e.g., a Z direction), and a connection portion 150b' connected to a lower portion or end of the vertically-provided portion 150a. In some embodiments, the connection portion 150b' may extend across a bottom of the pipe shape of the vertically-provided portion 150a. An interior of the channel layers 150' may be filled with a first insulating layer 182.

The connection portion 150b' may include a first plane PL1 extended below a bottom portion of a gate dielectric layer 160 and a second plane PL2 inclined at a specific angle α with respect to a top surface of the substrate 101. The connection portion 150b' may further include a third plane PL3 connecting the first plane PL1 to the second plane PL2. In some embodiments, the first plane PL1 may be parallel, or substantially parallel, to the top surface of the substrate 101.

The connection portion 150b' may include a plurality of the second planes PL2, while the second planes PL2 may meet each other to form a pointed shape, pointed toward a substrate disposed therebelow. For example, the plurality of second planes PL2 may form a faceted conical or pyramidical shape.

The first plane PL1 and the second plane PL2 of the connection portion 150b' may meet below the gate dielectric layer 160. In addition, the second plane PL2 and the third plane PL3 may also meet below the gate dielectric layer 160.

The first plane PL1 may be provided as an interface at which the connection portion 150b' is in contact with a portion of a bottom surface of the gate dielectric layers 160, and may be formed on the same plane as the bottom surface of the gate dielectric layers 160. In some embodiments, a bottom surface of the blocking layer 166 may be adjacent to and facing the first plane PL1.

For example, in a case in which the substrate 101 is provided as a (100) silicon substrate, an angle α between the second plane PL2 of the connection portion 150b' and the top surface of the substrate 101 may be substantially the same as the angle between a (100) crystal plane and a (111) crystal plane of a diamond crystal structure.

Figure 6A:
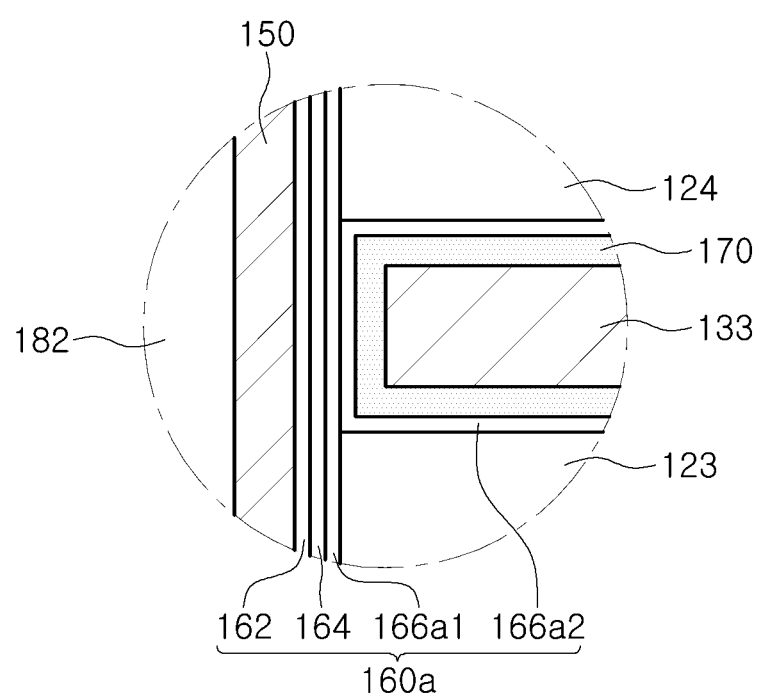
FIGS. 6A and 6B are cross-sectional views illustrating a gate dielectric layer according to an example embodiment, and a region corresponding to region 'B' in FIG. 3 is illustrated therein.
Figure 6B:
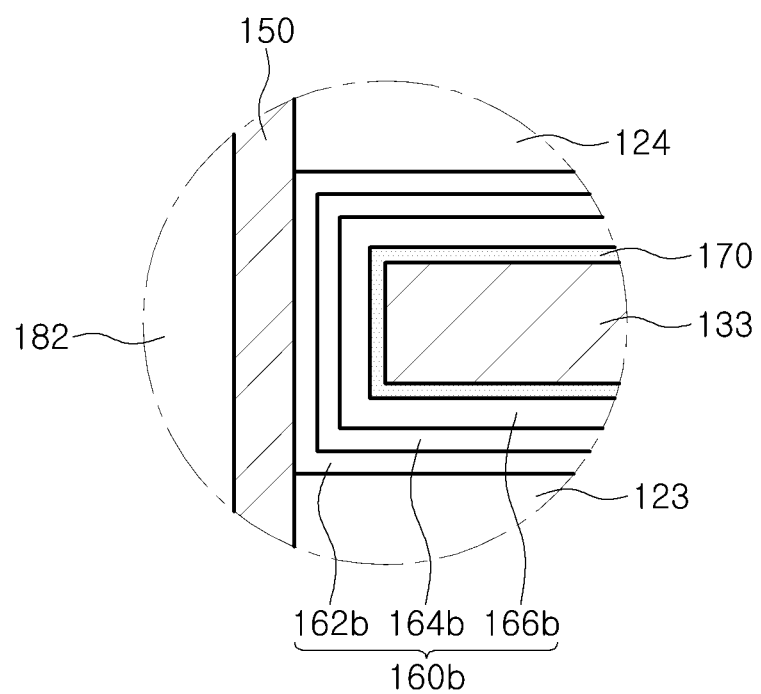

FIGS. 6A and 6B are cross-sectional views illustrating gate dielectric layers according to example embodiments, and a region corresponding to region 'B' in FIG. 3 is illustrated therein.

With reference to FIG. 6A, a gate electrode 133, a diffusion barrier 170, a gate dielectric layer 160a, a channel layer 150, and a first insulating layer 182 of memory cell strings are illustrated. The gate dielectric layer 160a may have a structure in which a tunneling layer 162, a charge storage layer 164, and blocking layers 166a1 and 166a2 are stacked on the channel layer 150 in sequence. For example, the tunneling layer 162 may be stacked on the channel layer 150, the charge storage layer 164 may be stacked on the tunneling layer 162, the blocking layer 166a1 may be stacked on the charge storage layer 164, and the blocking layer 166a2 may be stacked on the blocking layer 166a1. A thickness of the layers configuring the gate dielectric layer 160 is not limited to the thickness illustrated in an example embodiment, but may be variously changed.

In a manner different from example embodiments in FIGS. 4 and 5, in the case of the gate dielectric layer 160a, the blocking layers 166a1 and 166a2 may include two layers. For example, a first blocking layer 166a1 may be vertically extended in a manner the same as the channel layer 150, and a second blocking layer 166a2 may be disposed to substantially surround the gate electrode 133 and the diffusion barrier 170. For example, the second blocking layer 166a2 may include a material having a dielectric constant higher than that of the first blocking layer 166a1.

With reference to FIG. 6B, the gate electrode 133, the diffusion barrier 170, a gate dielectric layer 160b, the channel layer 150, and the first insulating layer 182 of the memory cell strings are illustrated. The gate dielectric layer 160b may have a structure in which a tunneling layer 162b, a charge storage layer 164a, and a blocking layer 166b are stacked on the channel layer 150 in sequence. In a manner different from example embodiments in FIGS. 4 and 5, the gate dielectric layer 160b in the example embodiment may be disposed in such a manner that an entirety of the tunneling layer 162b, the charge storage layer 164a, and the blocking layer 166b may substantially surround the gate electrode 133 and the diffusion barrier 170.

FIGS. 7 to 18 are schematic views of main operations illustrating a method of manufacturing a semiconductor device according to example embodiments. FIGS. 7 to 18 may illustrate a region corresponding to a cross-sectional view taken along line X-Z of a perspective view in FIG. 3.

Figure 7:
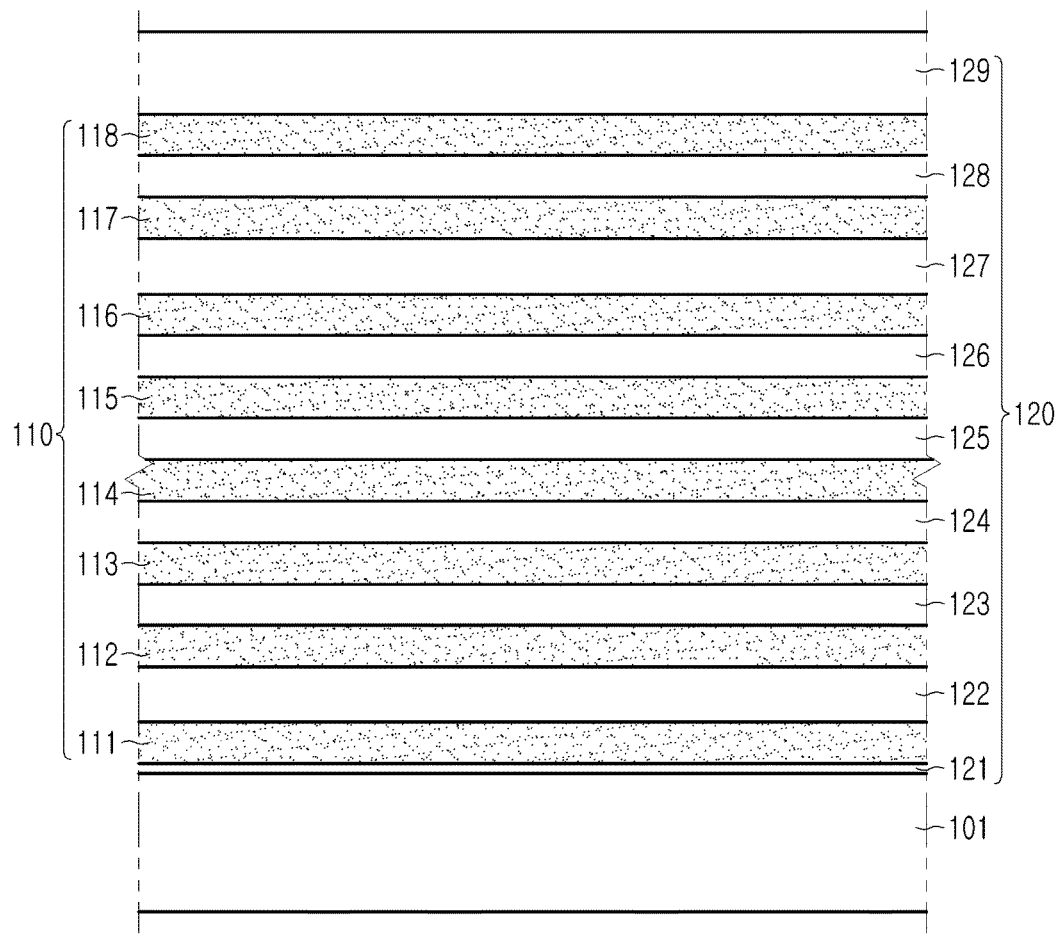
FIGS. 7 to 18 are schematic views illustrating a method of manufacturing a semiconductor device according to an example embodiment.

With reference to FIG. 7, sacrificial layers 110 (e.g., sacrificial layers 111 to 118) and interlayer insulating layers 120 (e.g., interlayer insulating layers 121 to 129) may be alternately stacked on a substrate 101. As illustrated, the interlayer insulating layers 120 and the sacrificial layers 110 may be alternately stacked on the substrate 101 starting from an interlayer insulating layer 121.

The sacrificial layers 110 may include a material to be etched, the material having etch selectivity with respect to the interlayer insulating layers 120. For example, the interlayer insulating layers 120 may include at least one of a silicon oxide and a silicon nitride. In addition, the sacrificial layers 110 may include a material different from that of the interlayer insulating layers 120, and may be selected from silicon, a silicon oxide, silicon carbide, and a silicon nitride.

As illustrated, thicknesses of the interlayer insulating layers 120 in an example embodiment may not be the same. For example, the thicknesses of the interlayer insulating layers 120 may be different from one another. For example, the interlayer insulating layer 121 disposed in a bottom portion of the interlayer insulating layers 120 may be formed to be relatively thin, while an interlayer insulating layer 129 disposed in a top portion of the interlayer insulating layers 120 may be formed to be relatively thick. In addition, interlayer insulating layers 122 and 127 may be formed to be thicker than interlayer insulating layers 123 to 126 and 128. However, a thickness of the interlayer insulating layers 120 and the sacrificial layers 110 may be variously changed and may be different from that illustrated in FIG. 7. In addition, the number of films configuring the interlayer insulating layers 120 and the sacrificial layers 110 may also be variously changed, and may be more or less than the quantities illustrated.

Figure 8:
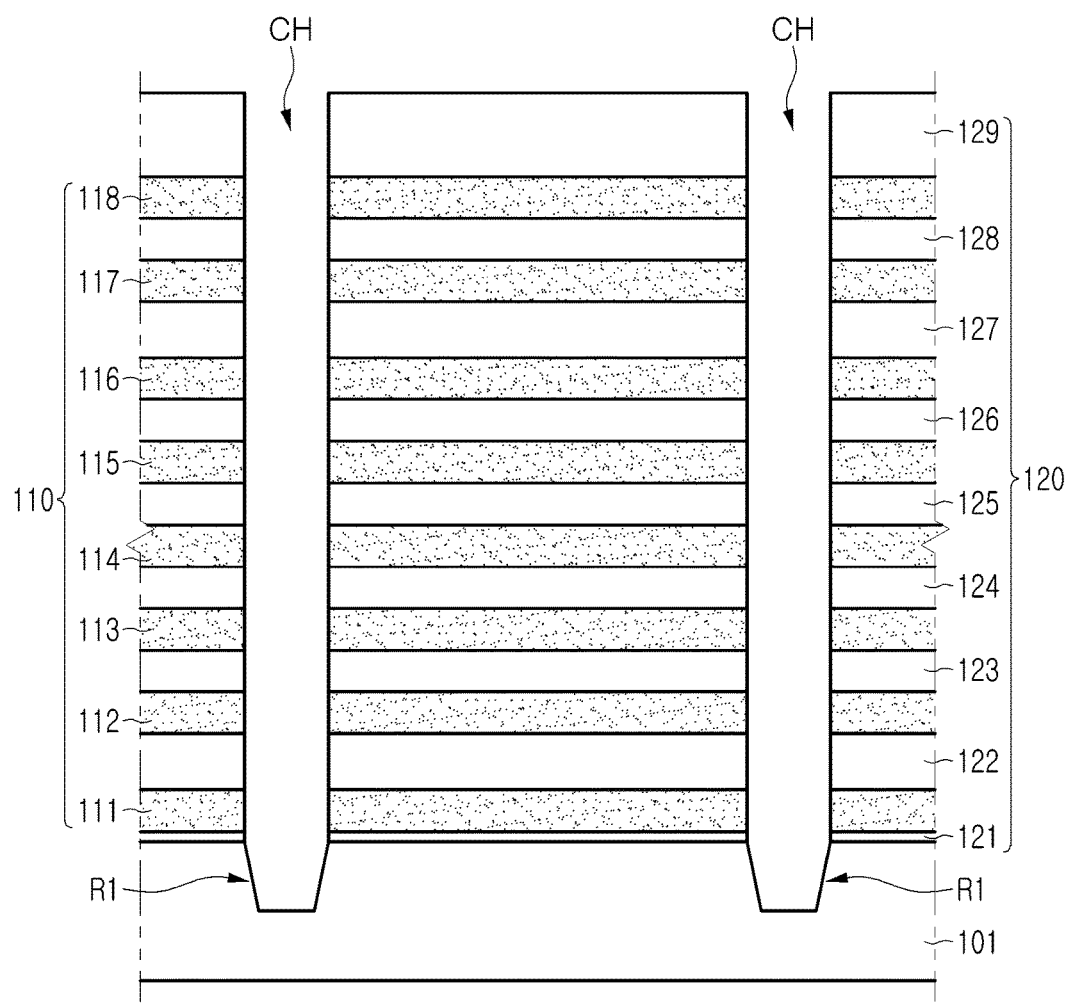

With reference to FIG. 8, channel holes CH penetrating through the sacrificial layers 110 and the interlayer insulating layers 120 may be formed.

The channel holes CH may be extended to the substrate 101 in a Z direction, and a recessed region R may be formed in the substrate 101. The channel holes CH may be formed through an anisotropic etching process of the sacrificial layers 110 and the interlayer insulating layers 120. A side wall of the channel holes CH may not be perpendicular to a top surface of the substrate 101. For example, a width of the channel holes CH may be reduced in a direction toward the top surface of the substrate 101. For example, the channel holes CH may have a narrower cross-sectional width at portions near the top surface of the substrate 101, and may have a wider cross-sectional width at portions farther away from the top surface of the substrate 101.

Figure 9:
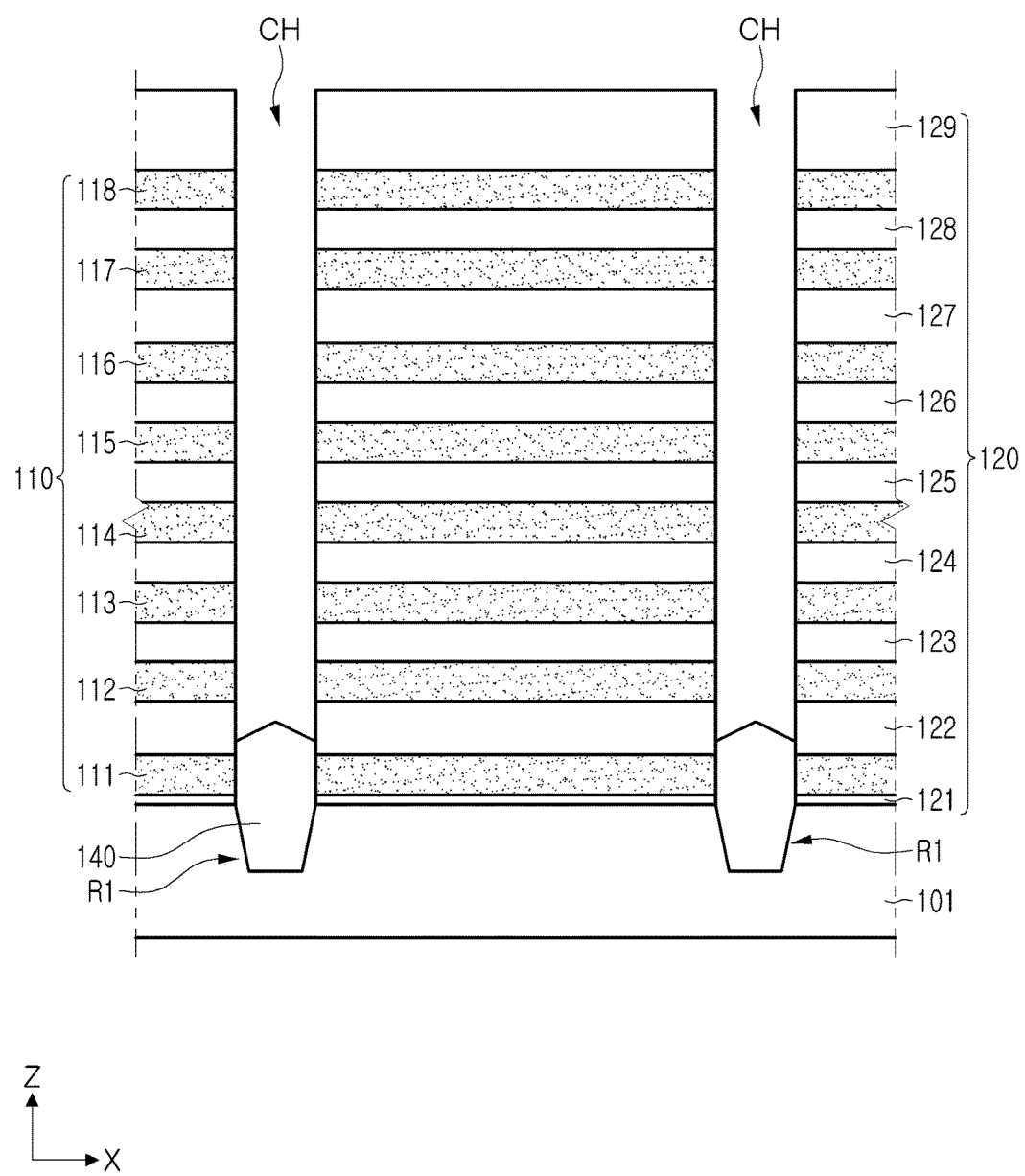

With reference to FIG. 9, an epitaxial layer 140 may be formed on a recessed region R1 in a lower portion of the channel holes CH. In some embodiments, the epitaxial layer 140 may be formed to fill the recessed region R1.

The epitaxial layer 140 may be formed in such a manner that an SEG process is performed using the substrate 101 in the recessed region R1 as a seed. The epitaxial layer 140 may be formed to have a single layer structure or a multilayer structure including different growth conditions or compositions.

The epitaxial layer 140 may be doped with an impurity. The impurity may be provided as a conductive impurity the same as that in the substrate 101 or opposite thereto.

A top surface of the epitaxial layer 140 may be formed to be higher than a top surface of a sacrificial layer 111 disposed adjacently to the substrate 101. In addition, the top surface of the epitaxial layer 140 may be formed to have a convex shape in an opposite direction to the substrate 101. For example, the top surface of the epitaxial layer 140 may protrude in the Z direction, away from the top surface of the substrate 101, and may form a conical or pyramidical shape. However, in some embodiments, the top surface of the epitaxial layer 140 may be formed to have a flat shape, depending on growth conditions, or the like.

Figure 10:
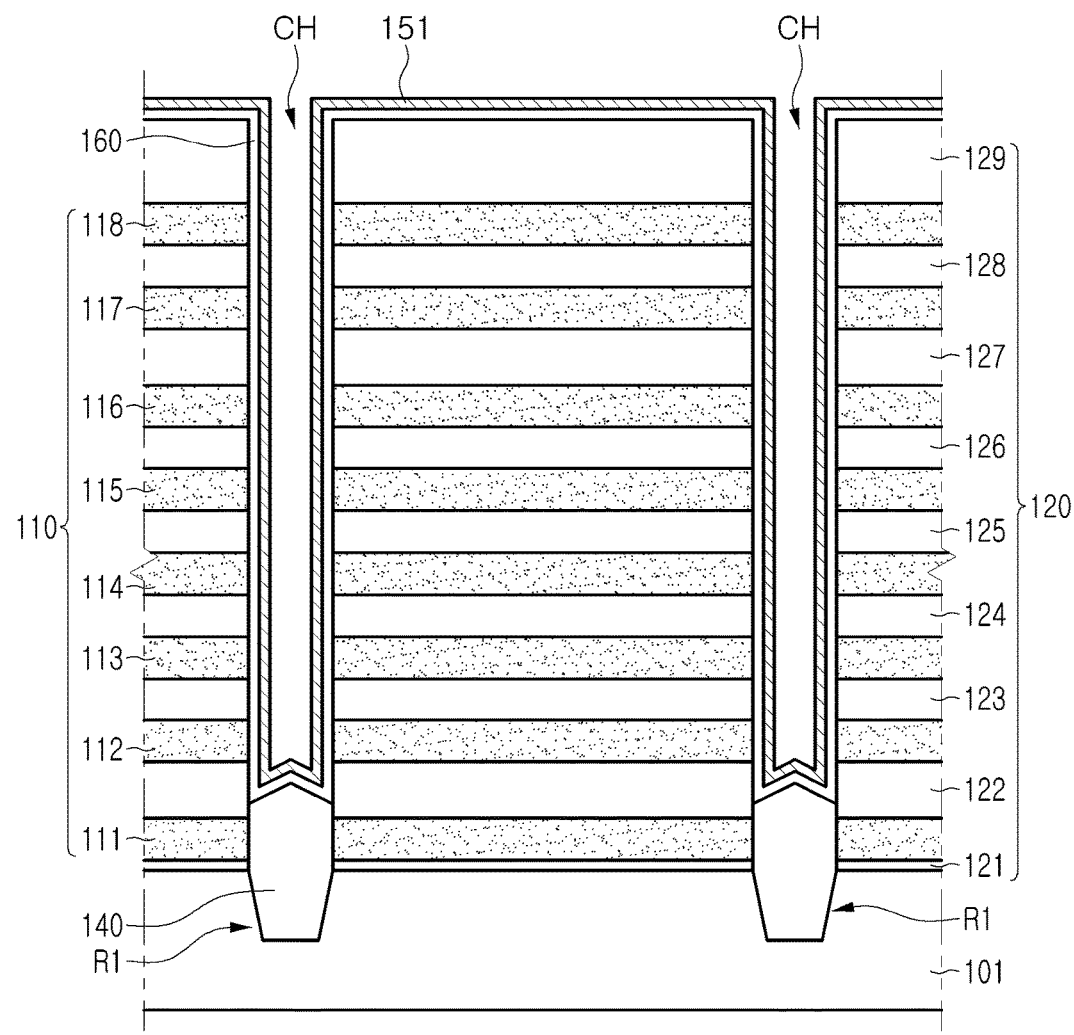

With reference to FIG. 10, a gate dielectric layer 160 and a sacrificial semiconductor film 151 may be formed in the channel holes CH, and above the sacrificial layers 110 and the interlayer insulating layers 120.

The gate dielectric layer 160 may be formed to have a uniform thickness on a side wall of the channel holes CH, the top surface of the epitaxial layer 140, and a top surface of the uppermost one of the interlayer insulating layers 120 (e.g., interlayer insulating layer 129).

The gate dielectric layer 160 may include a blocking layer 166, a charge storage layer 164, and a tunneling layer 162 formed in sequence.

The sacrificial semiconductor film 151 may be formed on the gate dielectric layer 160 to have a uniform thickness. The sacrificial semiconductor film 151 may include a semiconductor material, such as polycrystalline silicon and amorphous silicon. For example, the sacrificial semiconductor film 151 may be provided as polycrystalline silicon.

The gate dielectric layer 160 and the sacrificial semiconductor film 151 may be formed using an atomic layer deposition (ALD) method or a chemical vapor deposition (CVD) method.

Figure 11:
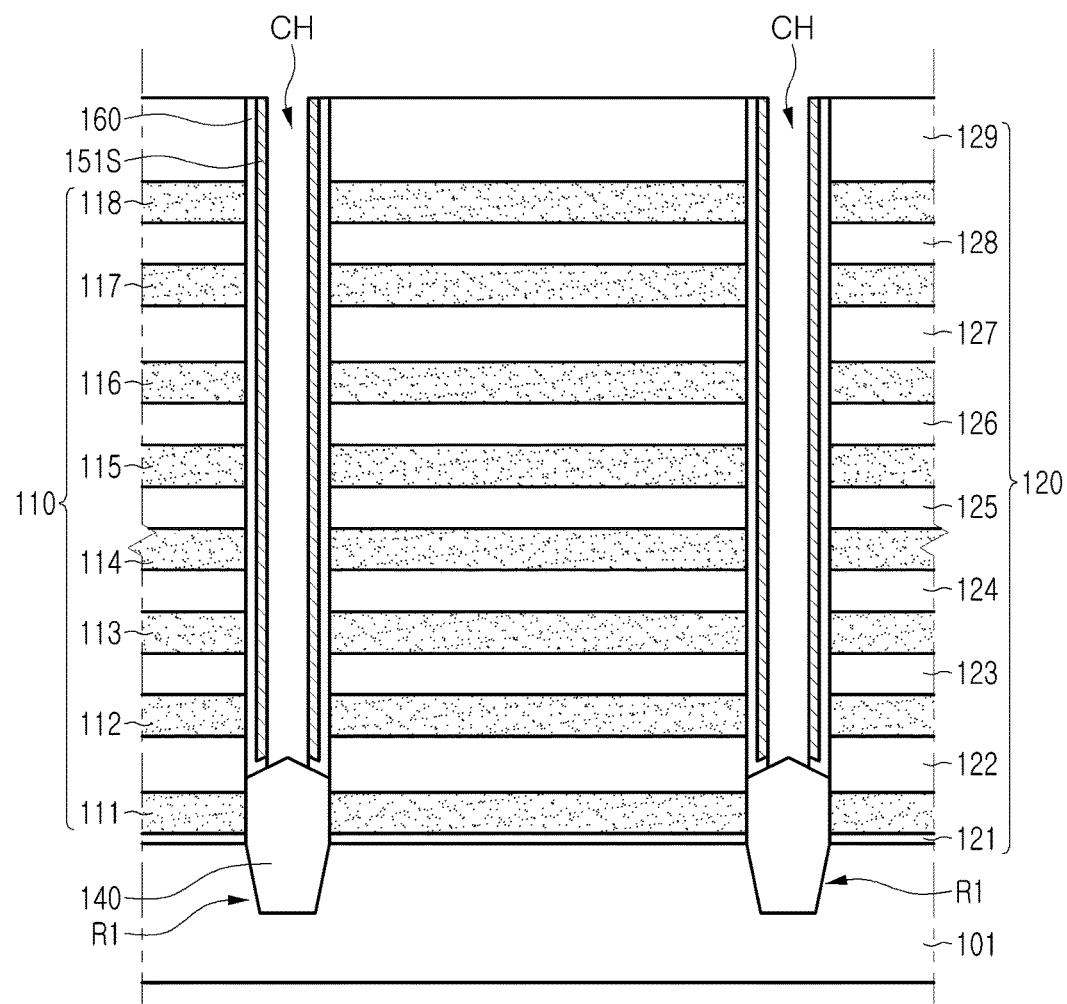

With reference to FIG. 11, in a subsequent process, in order to allow a channel layer 150 to be in direct contact with the epitaxial layer 140, a portion of the gate dielectric layer 160 may be removed from the channel holes CH.

A sacrificial spacer layer 151S may be formed on a side wall of the gate dielectric layer 160 through the anisotropic etching process of the sacrificial semiconductor film 151. The sacrificial spacer layer 151S may allow the portion of the gate dielectric layer 160 formed on the top surface of the epitaxial layer 140 to be exposed in a lower portion of the channel hole CH.

Subsequently, the gate dielectric layer 160 may be selectively removed in such a manner that the gate dielectric layer 160 is anisotropically etched using the sacrificial spacer layer 151S as an etching mask. In the meantime, during the anisotropic etching process, the gate dielectric layer 160 disposed below the sacrificial spacer layer 151S may not be etched. Therefore, the gate dielectric layer 160 may include an L-shaped cross section on the side wall of the channel hole CH.

When the gate dielectric layer 160 is etched, a portion of the epitaxial layer 140 may be etched at the same time. In some embodiments, a portion of the top surface of the epitaxial layer 140 may be exposed.

Figure 12:
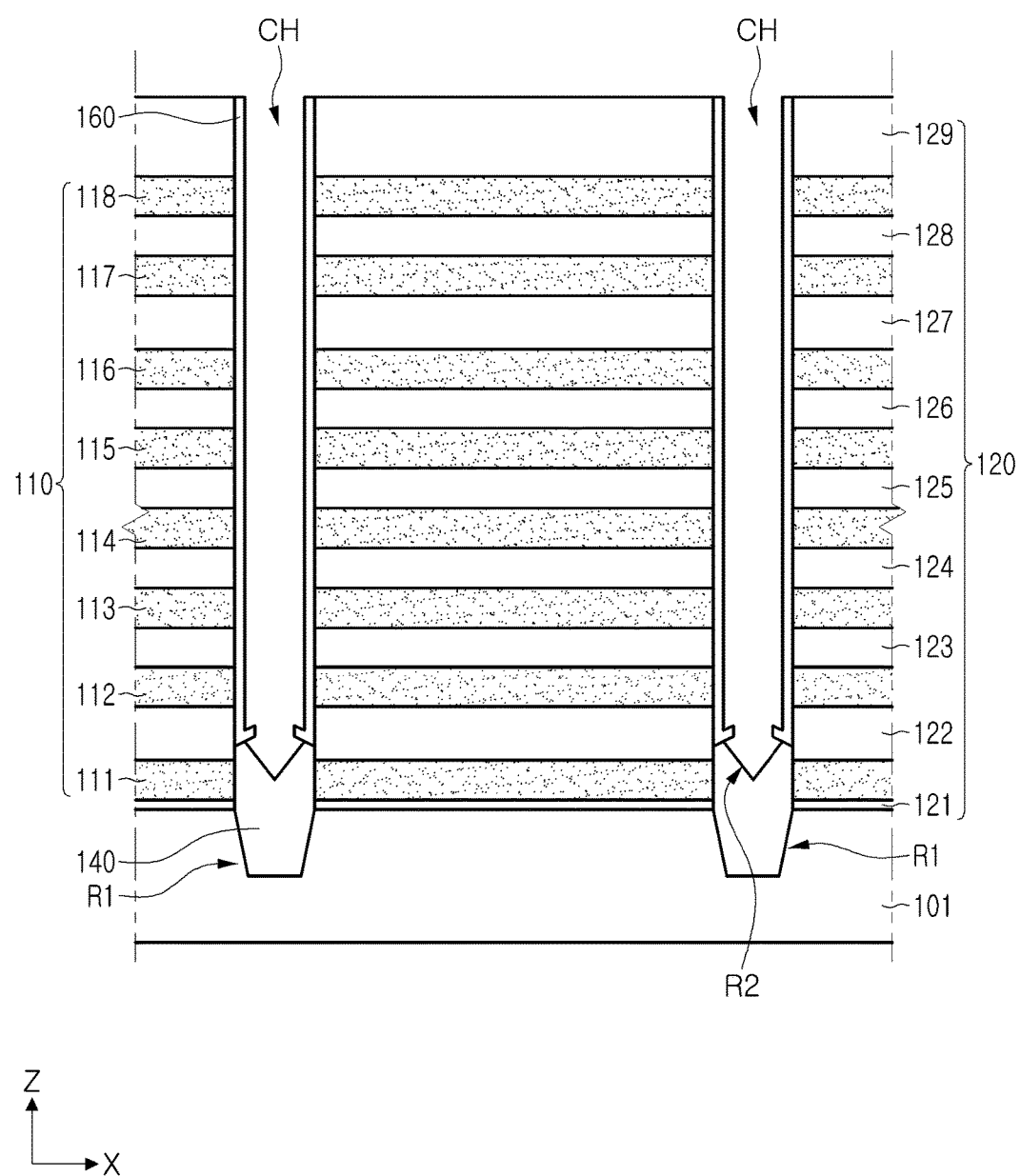

With reference to FIG. 12, the sacrificial spacer layer 151S may be removed, and a recessed region R2 may be formed in an upper portion of the epitaxial layer 140.

The sacrificial spacer layer 151S may be removed through an anisotropic wet etching process. The sacrificial spacer layer 151S and the epitaxial layer 140 may include the same material. In this case, during the anisotropic wet etching process of the sacrificial spacer layer 151S, the upper portion of the epitaxial layer 140 may be etched together with the sacrificial spacer layer 151S, and thus the recessed region R2 may be formed. For example, in a case in which both the sacrificial spacer layer 151S and the epitaxial layer 140 include Si, the anisotropic wet etching process may be performed using an alkaline solution including $NH_4OH$, NaOH, or KOH. Through the anisotropic wet etching process, the recessed region R2 may be extended below the gate dielectric layer 160, and may include inclined planes tilting at a specific angle with respect to the top surface of the substrate 101. Due to the inclined planes, the recessed region R2 may include a V-shaped cross section as illustrated in FIG. 12. The inclined planes may correspond to a (111) crystal plane of a diamond crystal structure. In a case in which the substrate 101 is provided as a (100) silicon substrate, an angle between the inclined planes and the top surface of the substrate 101 may be the same as the angle between a (100) crystal plane and the (111) crystal plane of the diamond crystal structure.

Figure 13:
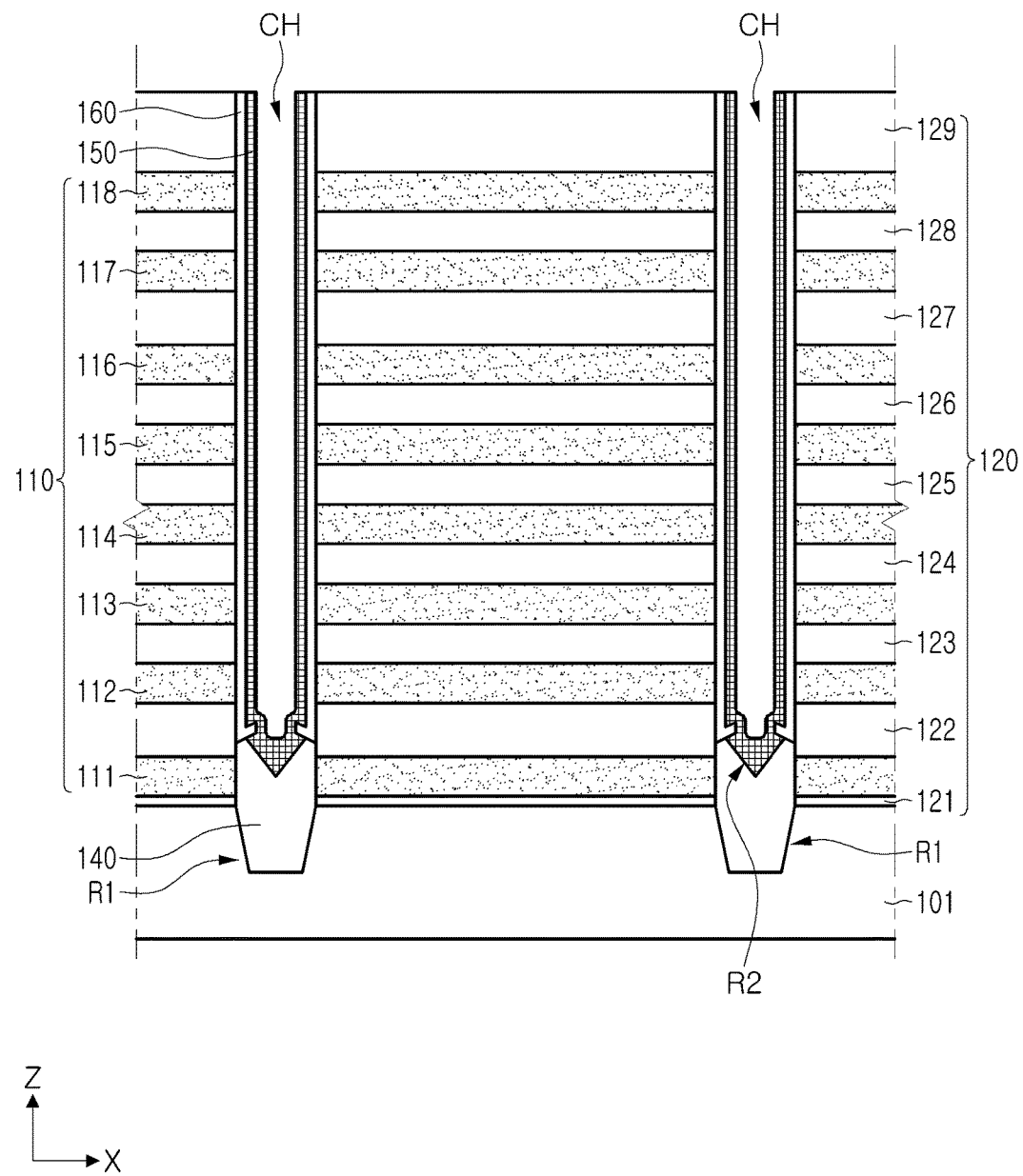

With reference to FIG. 13, the channel layer 150 may be formed in the channel holes CH.

The channel layer 150 may be formed on the gate dielectric layer 160 to have a specific thickness using the ALD or the CVD method. The channel layer 150 may include a semiconductor material, such as polycrystalline silicon and amorphous silicon. Although not illustrated in FIG. 13, the channel layer 150 may be formed on the interlayer insulating layer 129.

The channel layer 150 may be formed to allow the recessed region R2 of the epitaxial layer 140 to be filled.

In a case in which the channel layer 150 includes polycrystalline silicon, in order to prevent the channel layer 150 from being cut off or removed, the channel layer 150 may be formed to be thicker than a final thickness, and the thickness thereof may be adjusted to have a required final thickness through a trimming process. The trimming process may be accurately performed using a solution, such as an SC1 solution. The SC1 solution refers to a mixture solution including deionized water, $NH_4OH$, and $H_2O_2$ in a ratio of 5:1:1.

Figure 14:
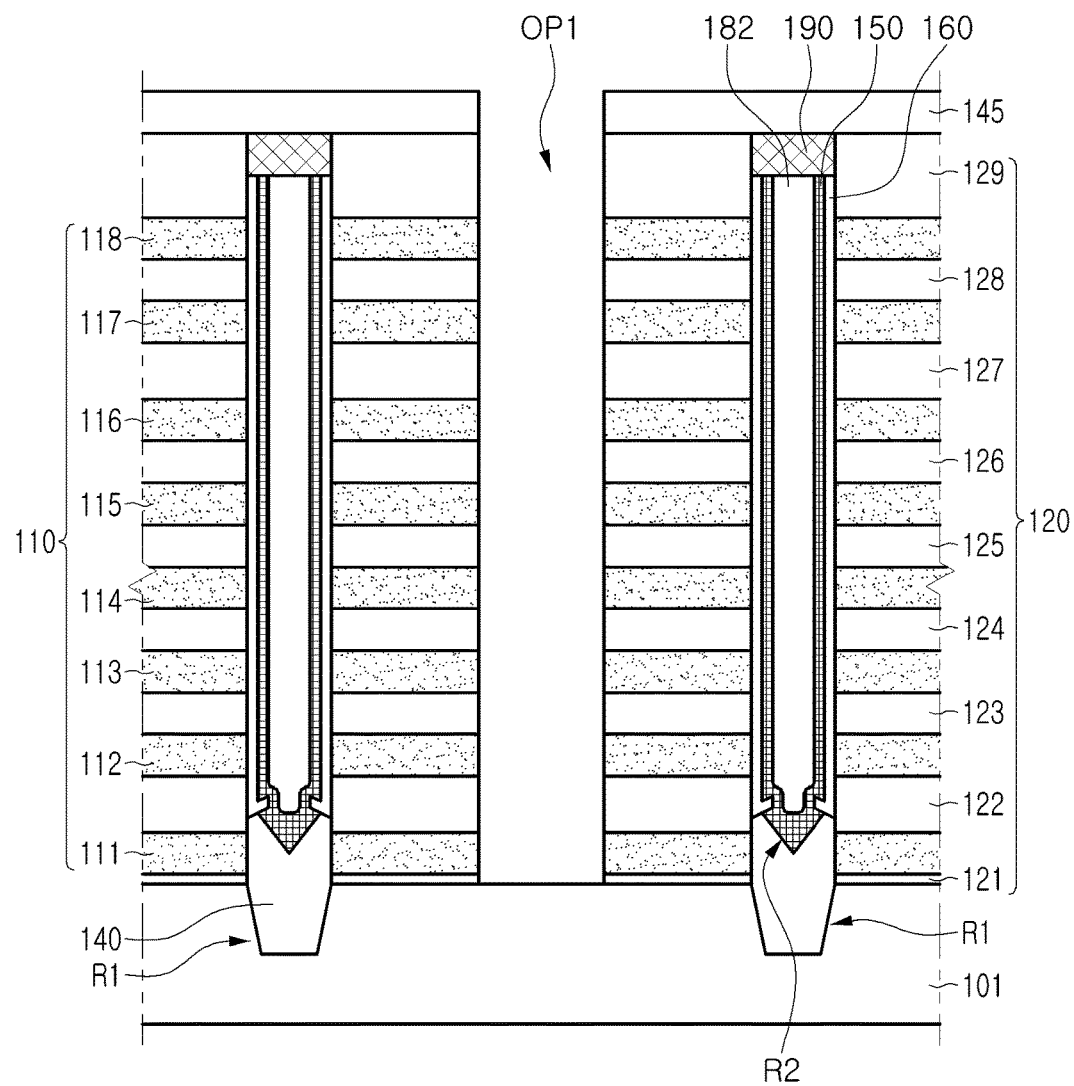

With reference to FIG. 14, a first insulating layer 182 to allow the channel holes CH to be filled and a conductive pad 190 on the first insulating layer 182 may be formed. The first insulating layer 182 may be provided as an insulating material. The conductive pad 190 may be provided as a doped semiconductor material.

Subsequently, a first opening OP1 may be formed. The first opening OP1 may allow laminates of the sacrificial layers 110 and the interlayer insulating layers 120 to be spaced apart by a predetermined interval. An additional insulating layer 145 may be formed on the interlayer insulating layer 129 disposed in the top portion of the interlayer insulating layers 120 and the conductive pad 190, and the first opening OP1 may be formed. The insulating layer 145 may prevent damage to the conductive pad 190 and the channel layer 150 during the subsequent process. The first opening OP1 may be formed in such a manner that a mask layer is formed using a photolithography process, and the sacrificial layers 110 and the interlayer insulating layers 120 are anisotropically etched. The first opening OP1 may be formed to have a trench form extended in a Y direction (see, for example, FIG. 3). The first opening OP1 may allow the substrate 101 to be exposed between the channel layers 150.

Figure 15:
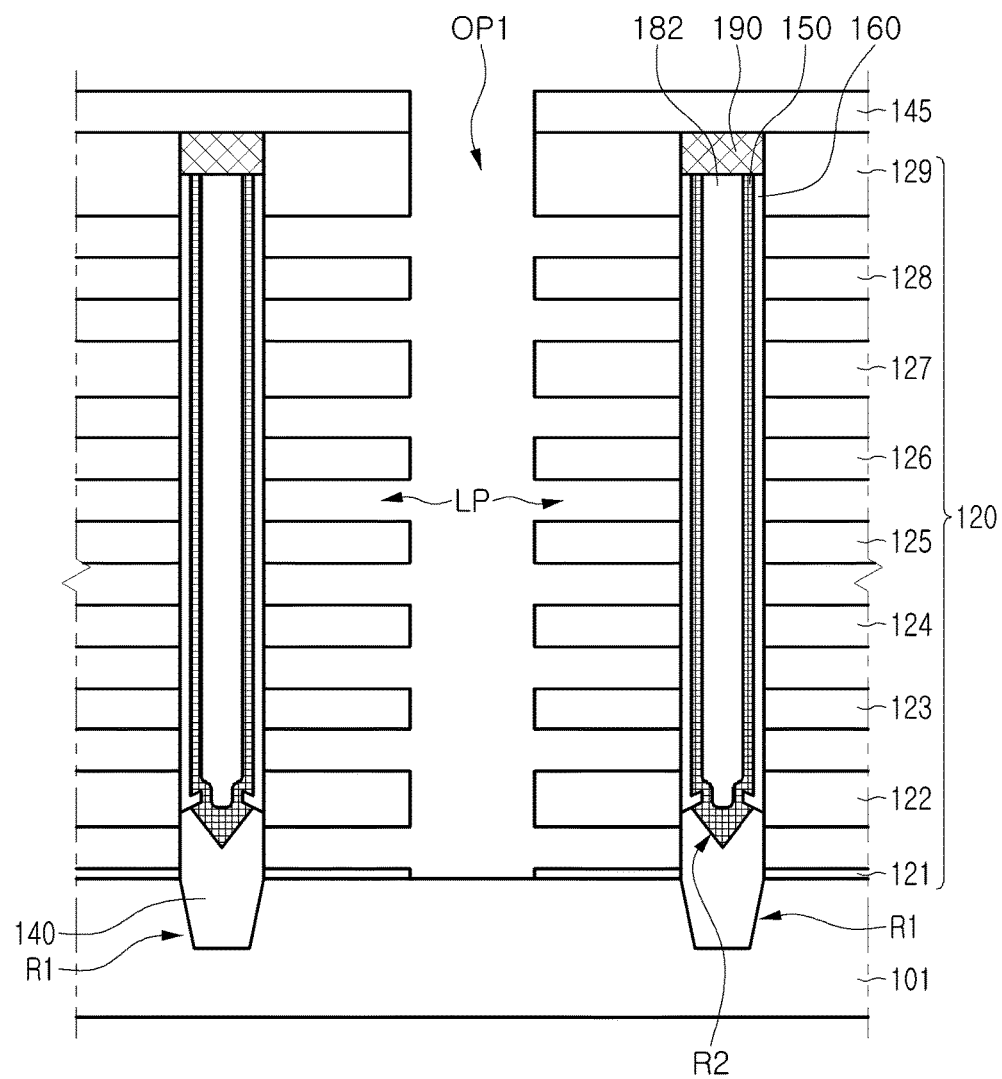

With reference to FIG. 15, the sacrificial layers 110 exposed through the first opening OP1 may be removed using an etching process. Thus, a plurality of lateral openings LP disposed between the interlayer insulating layers 120 may be formed. Through the lateral openings LP, a portion of side walls of the gate dielectric layers 160 and an epitaxial layer 140 may be exposed.

Figure 16:
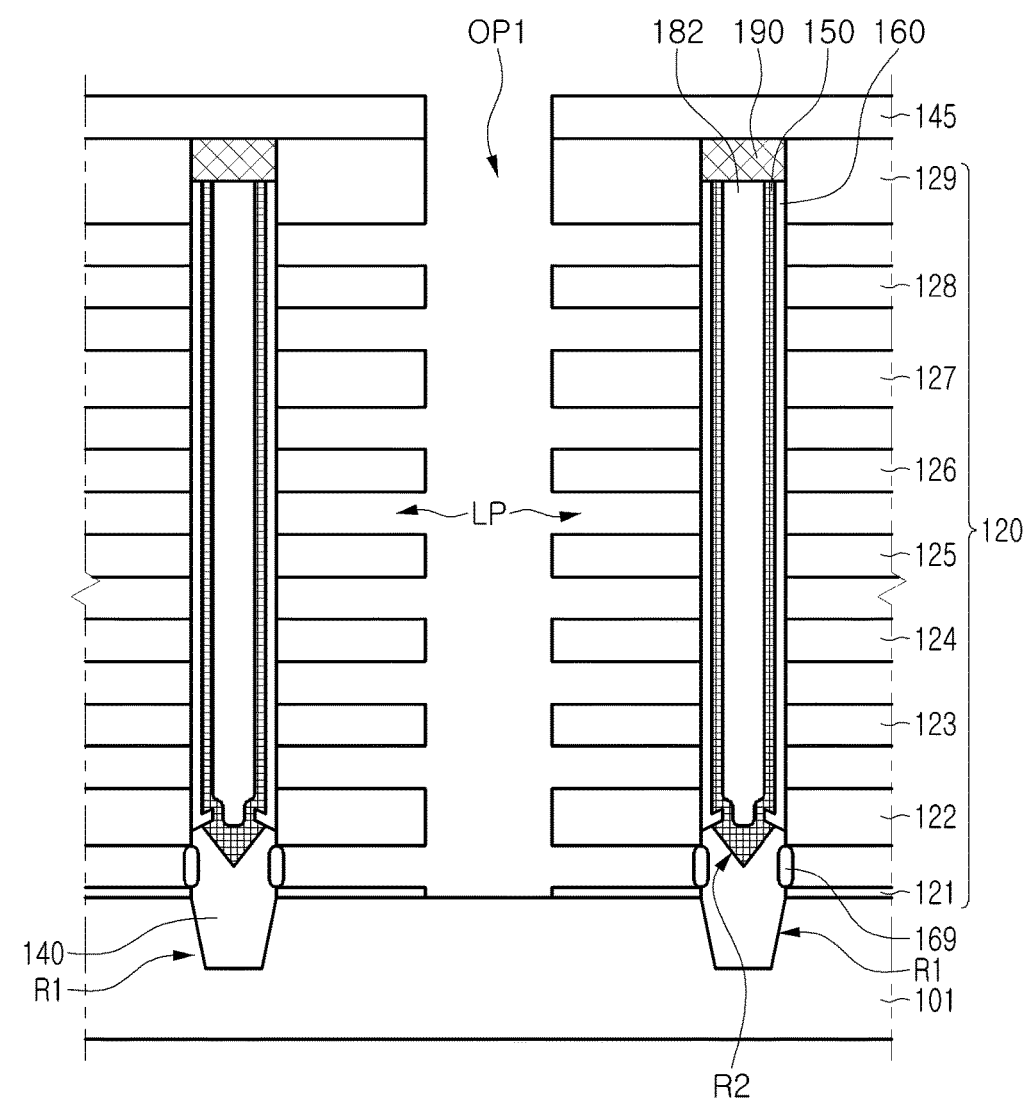

With reference to FIG. 16, an epitaxial insulating layer 169 may be formed on the epitaxial layer 140 exposed through the lateral openings LP.

For example, the epitaxial insulating layer 169 may be formed using an oxidation process. In this case, the epitaxial insulating layer 169 may be provided as an oxide film formed in such a manner that a portion of the epitaxial layer 140 is oxidized. A thickness and a form of the epitaxial insulating layer 169 are not limited to the illustrated embodiment.

In a case in which the oxidation process is performed in the operation, a portion of the gate dielectric layers 160 exposed through the lateral openings LP may be oxidized, and thus damage caused during the etching process in FIG. 15 may be cured.

Figure 17:
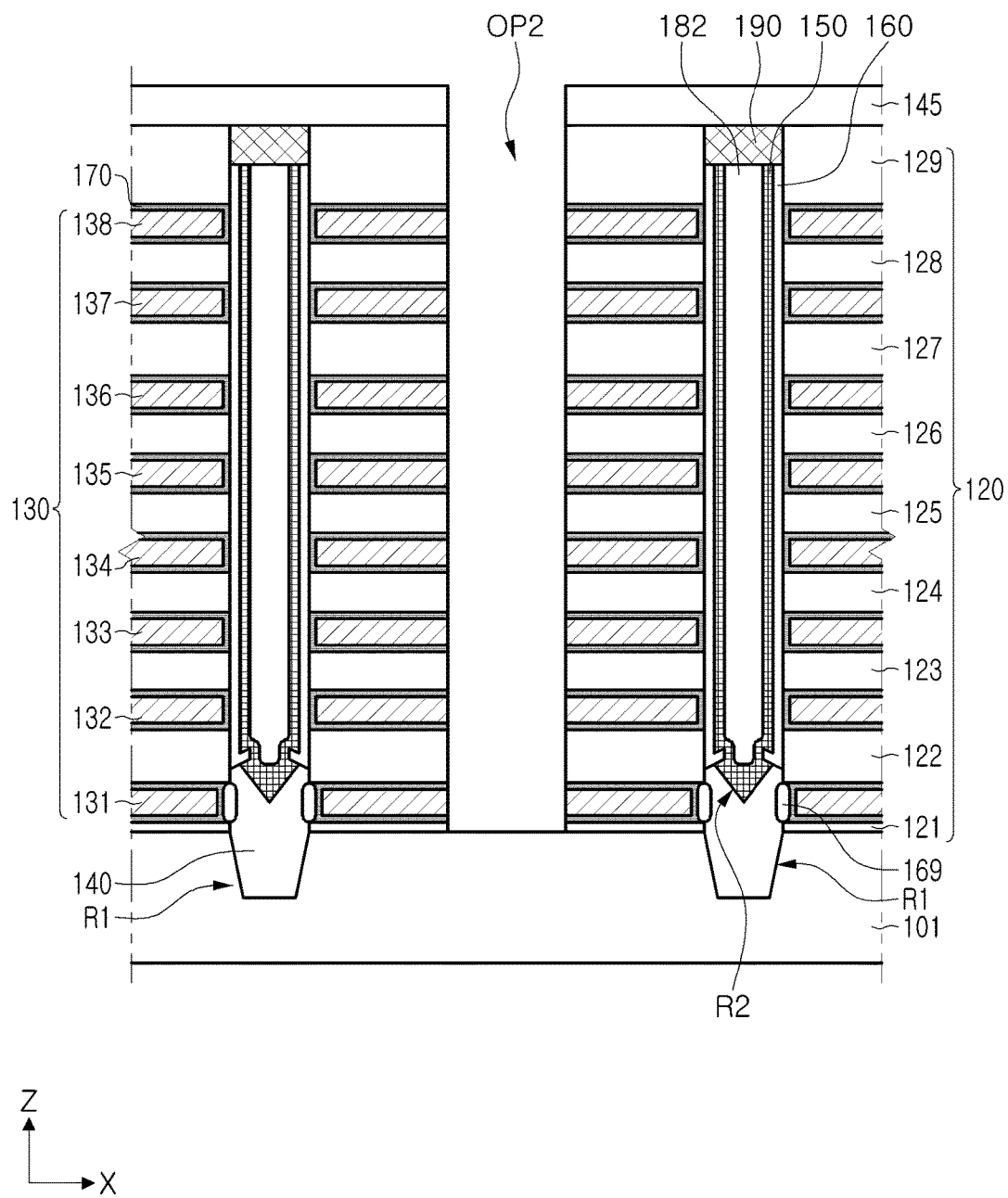

With reference to FIG. 17, a diffusion barrier 170 and a gate electrode 130 may be formed within the lateral openings LP.

First, the diffusion barrier 170 may be formed to cover the gate dielectric layer 160, the epitaxial insulating layer 169, the interlayer insulating layer 120, and the substrate 101, which are exposed through the first opening OP1 and the lateral openings LP. Subsequently, the gate electrode 130 may be formed to allow the lateral openings LP to be filled. The diffusion barrier 170 is illustrated to be distinguished from the gate electrode 130 in that the diffusion barrier 170 is provided as a conductive material, and includes a material different from that of the gate electrode 130. However, in terms of a function, the diffusion barrier 170 may be construed as a portion of the gate electrode 130. In some example embodiments, the diffusion barrier 170 may be omitted. The gate electrode 130 may include a metal, polycrystalline silicon, or a metal silicide material. The diffusion barrier 170 may include WN, TaN, TiN, or a combination thereof.

Subsequently, in order to allow the diffusion barrier 170 and the gate electrode 130 to only be disposed in the lateral opening LP, a material composing the diffusion barrier 170 and the gate electrode 130, formed in the first opening OP1, may be removed using an additional process, thus forming the second opening OP2. The second opening OP2 may have the trench form extended in the Y direction (see, for example, FIG. 3).

Figure 18:
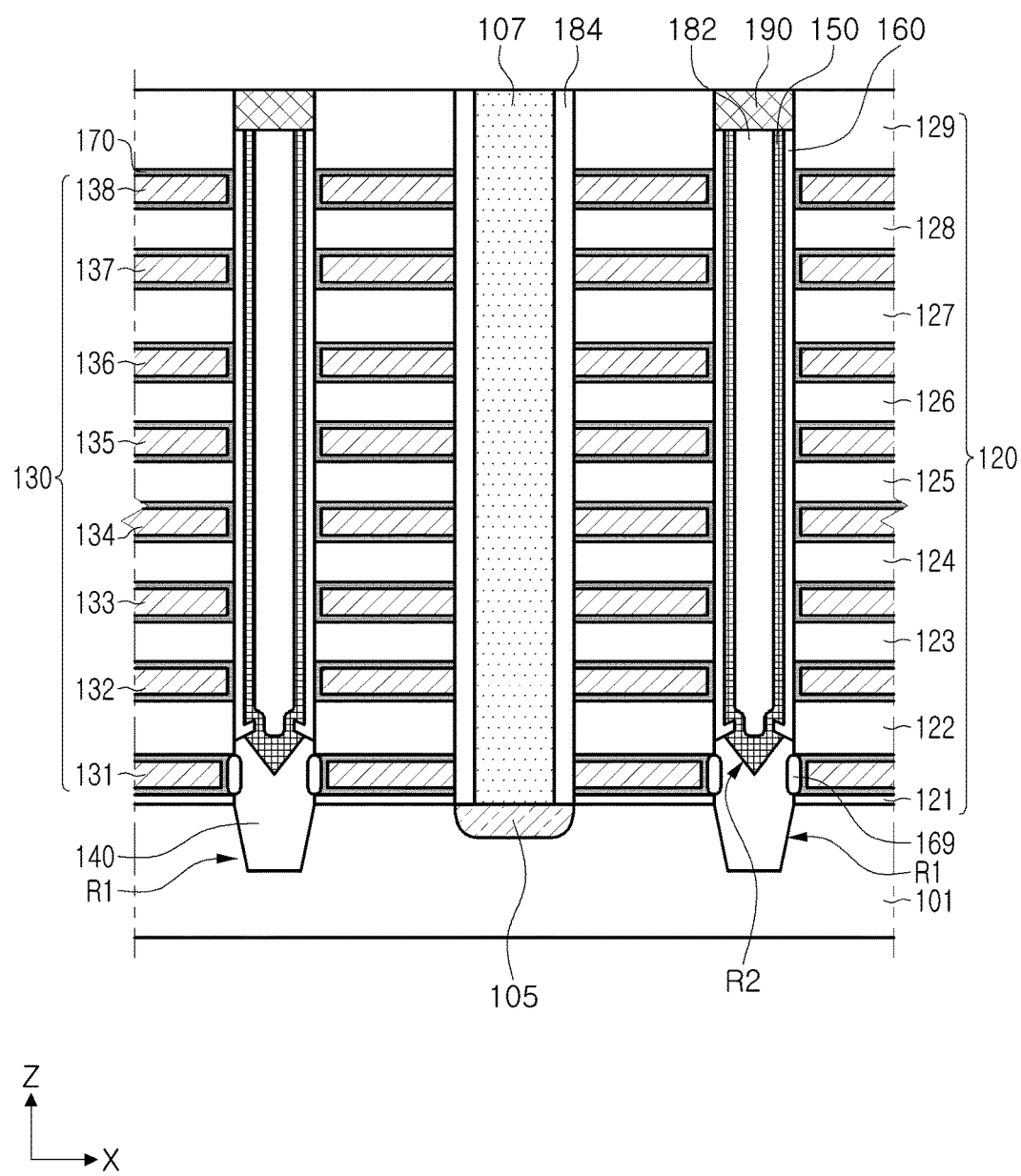

With reference to FIG. 18, an impurity region 105 may be formed in the substrate 101 in the second opening OP2, while a conductive layer 107 and a second insulating layer 184 may be formed on the impurity region 105.

First, the impurity may be injected into the substrate 101 exposed through the second opening OP2, thus forming the impurity region 105. Subsequently, the second insulating layer 184 may be formed on a side wall of the second opening OP2, and the conductive layer 107 may be formed. The conductive layer 107 may be formed on the impurity region 105, and may fill an area between the sidewall of the second opening OP2.

In an example embodiment, the impurity region 105 may be formed after the second insulating layer 184 is formed. The impurity region 105 may be configured to include regions having different impurity concentrations.

Subsequently, a contact plug connected to the conductive pad 190 may be further disposed, and a BL connected to the contact plug may be formed, which is not illustrated. The BL may extend in an X direction, and allow the conductive pads 190 arranged in the X direction to be connected.

Figure 19:
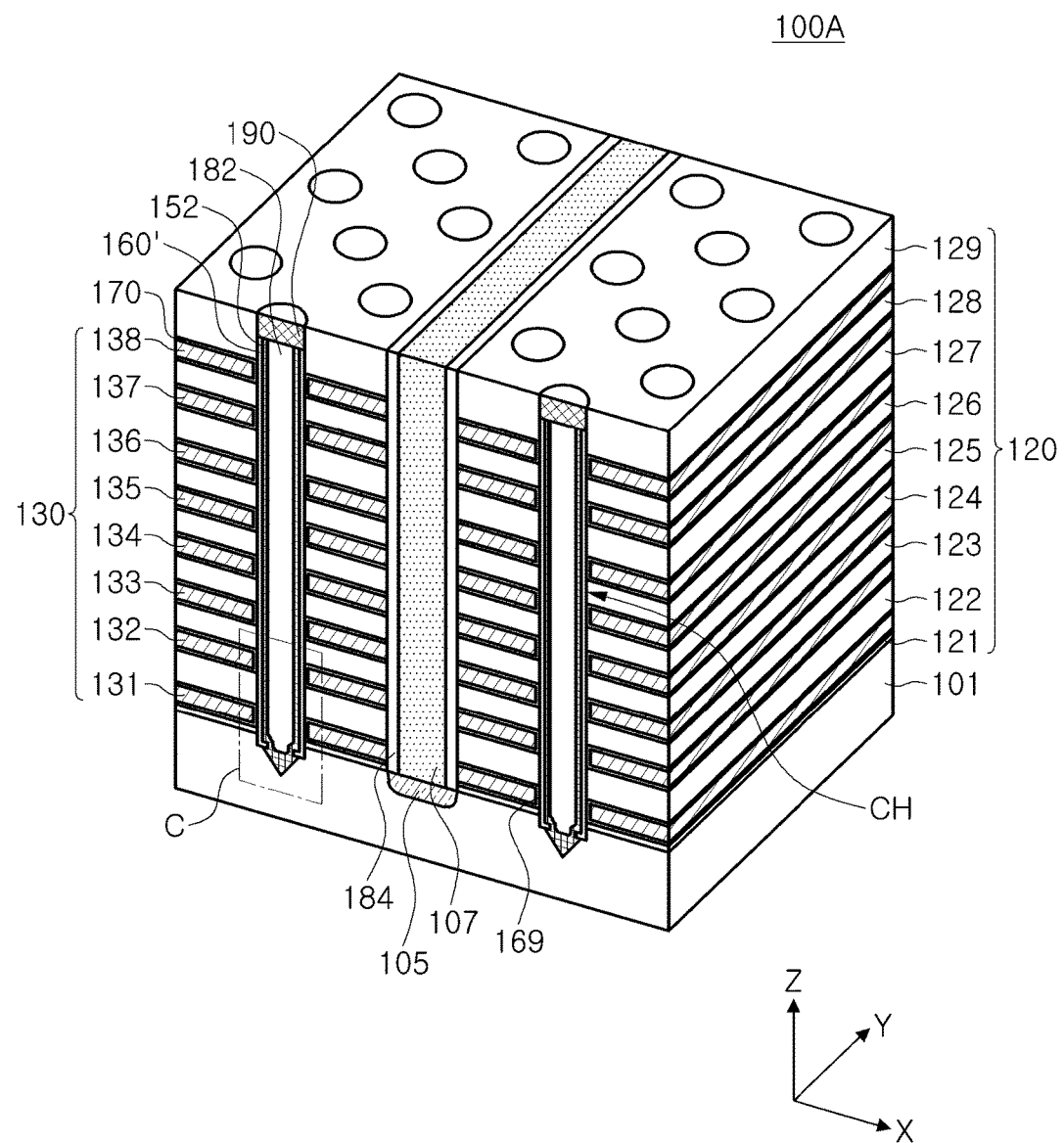
FIG. 19 is a schematic perspective view illustrating a structure of memory cell strings of a semiconductor device according to an example embodiment.
Figure 20:
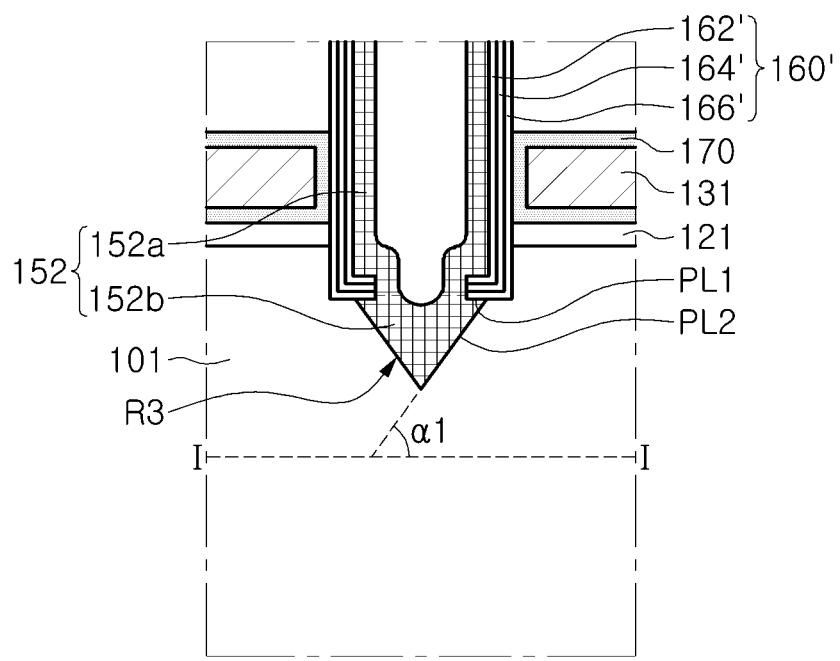
FIGS. 20 and 21 are cross-sectional views illustrating an epitaxial layer according to an example embodiment, and a region corresponding to region 'C' in FIG. 19 is illustrated therein.

FIG. 19 is a schematic perspective view illustrating a structure of memory cell strings of a semiconductor device 100A according to an example embodiment. FIG. 20 is a cross-sectional view illustrating a channel layer according to an example embodiment, and a region corresponding to region 'C' in FIG. 19 is illustrated therein.

With reference to FIGS. 19 and 20, a semiconductor device 100A may include a substrate 101, a plurality of channel layers 152 disposed in a direction perpendicular to a top surface of the substrate 101, and a plurality of interlayer insulating layers 120 and a plurality of gate electrodes 130, stacked along a side wall of the channel layers 152. In addition, the semiconductor device 100A may further include a gate dielectric layer 160' disposed between a channel layer 152 and a gate electrode 130, a conductive layer 107, and a conductive pad 190 disposed in an upper portion of a channel layer 152.

In a manner different from a semiconductor device 100 described with reference to FIGS. 3 and 4, the semiconductor device 100A may have a structure in which an epitaxial layer is not disposed between the channel layers 152 and the substrate 101. Therefore, only changed descriptions will be provided below.

Gate dielectric layers 160' may be disposed between gate electrodes 130 and channel layers 152. A bottom portion of the gate dielectric layer 160' may include an L-shaped cross section. The gate dielectric layer 160' may include a tunneling layer 162', a charge storage layer 164', and a blocking layer 166' are stacked on the channel layer 152 in sequence. The gate dielectric layer 160' in the example embodiment may be disposed in such a manner that an entirety of the tunneling layer 162', the charge storage layer 164', and the blocking layer 166' may be extended along the channel layer 152 in a vertical direction.

In the example embodiment, the gate dielectric layers 160' may be extended below the top surface of the substrate 101, and thus a bottom surface of the gate dielectric layers 160' may be formed in a position lower than the top surface of the substrate 101. For example, the bottom surface of the gate dielectric layers 160' may be located below the lowest interlayer insulating layer 120 (e.g., interlayer insulating layers 121).

Each channel layer 152 may include a vertically-provided portion 152a having a pipe shape and extended in a direction perpendicular to the top surface of the substrate 101 (e.g., a Z direction), and a connection portion 152b connected to a lower portion or end of the vertically-provided portion 152a. In some embodiments, the connection portion 152b may extend across a bottom of the pipe shape of the vertically-provided portion 152a. An interior of the channel layers 152 may be filled with a first insulating layer 182.

The connection portion 152b of the channel layer 152 may be disposed in the substrate 101. The connection portion 152b may include a first plane PL1 extended below the bottom portion of the gate dielectric layer 160' and a second plane PL2 inclined at a specific angle α1 with respect to a plane I-I parallel to the top surface of the substrate 101. In some embodiments, the first plane PL1 may be parallel, or substantially parallel, to the top surface of the substrate 101. The connection portion 152b may include a plurality of the second planes PL2, while the second planes PL2 may meet each other to form a pointed shape, pointed toward a substrate disposed therebelow.

The first plane PL1 and the second plane PL2 of the connection portion 152b may meet below the bottom portion of the gate dielectric layers 160'. In addition, the first plane PL1 may be provided as an interface at which the connection portion 152b is in contact with a portion of a bottom surface of the gate dielectric layer s160', and may be formed on the same plane as the bottom surface of the gate dielectric layer 160'. In some embodiments, a bottom surface of the blocking layer 166' may be adjacent to and facing the first plane PL1.

For example, in a case in which the substrate 101 is provided as the (100) silicon substrate, the angle α1 between the second plane PL2 of the connection portion 152b and the plane I-I parallel to the top surface of the substrate 101 may be substantially the same as the angle between the (100) crystal plane and the (111) crystal plane of the diamond crystal structure.

The substrate 101 may include a recessed region R3 in contact with the connection portion 152b of the channel layer 152. The connection portion 152b may be included in the recessed region R3 of the substrate 101.

The second plane PL2 of the connection portion 152b may be provided as the interface at which the substrate 101 is in contact with the channel layer 152. In a manufacturing process, a form or shape of the connection portion 152b may be determined by a form or shape of the recessed region R3 formed in the substrate 101.

Figure 21:
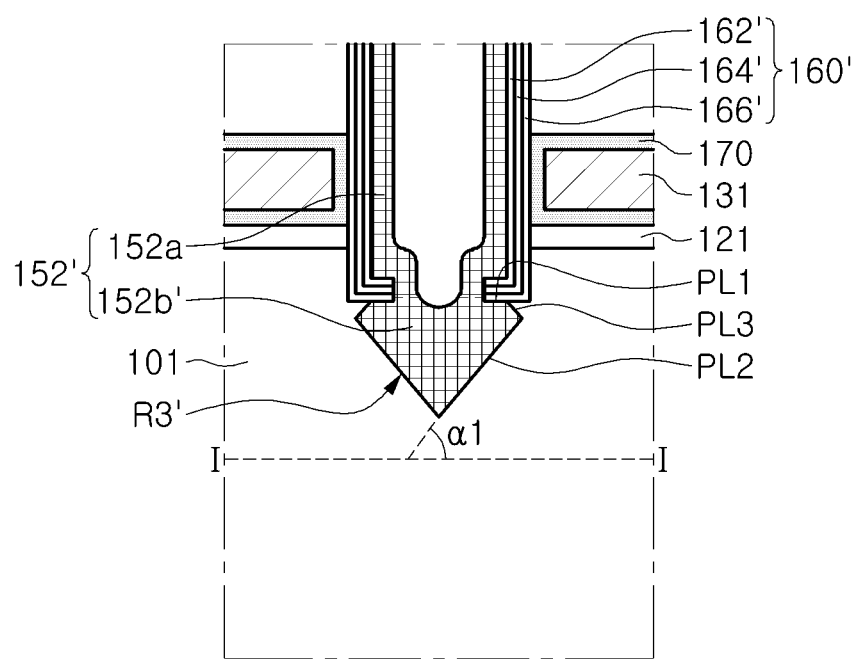

FIG. 21 is a cross-sectional view illustrating a channel layer according to an example embodiment, and a region corresponding to region 'C' in FIG. 19 is illustrated therein. FIG. 21 illustrates a structure in which a form of a connection portion of a channel layer illustrated in FIG. 20 is modified.

With reference to FIG. 21, respective channel layers 152' each may have a pipe shape or a macaroni shape, and may include a vertically-provided portion 152a extended in a direction perpendicular to the substrate 101 (e.g., a Z direction), and a connection portion 152b' connected to a lower portion or end of the vertically-provided portion. In some embodiments, the connection portion 152b' may extend across a bottom of the pipe or macaroni shape of the vertically-provided portion 152a. An interior of the channel layers 152' may be filled with a first insulating layer 182.

The connection portion 152b' may include a first plane PL1 extended below the bottom portion of the gate dielectric layer 160' and a second plane PL2 inclined at a specific angle α with respect to the top surface of the substrate 101. The connection portion 152b' may further include a third plane PL3 connecting the first plane PL1 to the second plane PL2. In some embodiments, the first plane PL1 may be parallel, or substantially parallel, to the top surface of the substrate 101.

The connection portion 152b' may include a plurality of the second planes PL2, while the second planes PL2 may meet each other to form a pointed shape, pointed toward a substrate disposed therebelow. For example, the plurality of second planes PL2 may form a conical or pyramidical shape having faceted planes.

The first plane PL1 and the second plane PL2 of the connection portion 152b' may meet below the gate dielectric layer 160', while the second plane PL2 and the third plane PL3 may also meet below the gate dielectric layer 160'.

The first plane PL1 may be provided as an interface at which the connection portion 152b' is in contact with a portion of a bottom surface of the gate dielectric layer 160', and may be formed on the same plane as the bottom surface of the gate dielectric layer 160'.

For example, in a case in which the substrate 101 is provided as a (100) silicon substrate, an angle α1 between the second plane PL2 of the connection portion 152b' and a plane I-I parallel to the top surface of the substrate 101 may be substantially the same as the angle between a (100) crystal plane and a (111) crystal plane of a diamond crystal structure.

FIGS. 22 to 26 are schematic views of main operations illustrating a method of manufacturing a semiconductor device according to an example embodiment. Hereinafter, with reference to FIGS. 7 to 18, descriptions different from the example embodiments described above will be provided.

Figure 22:
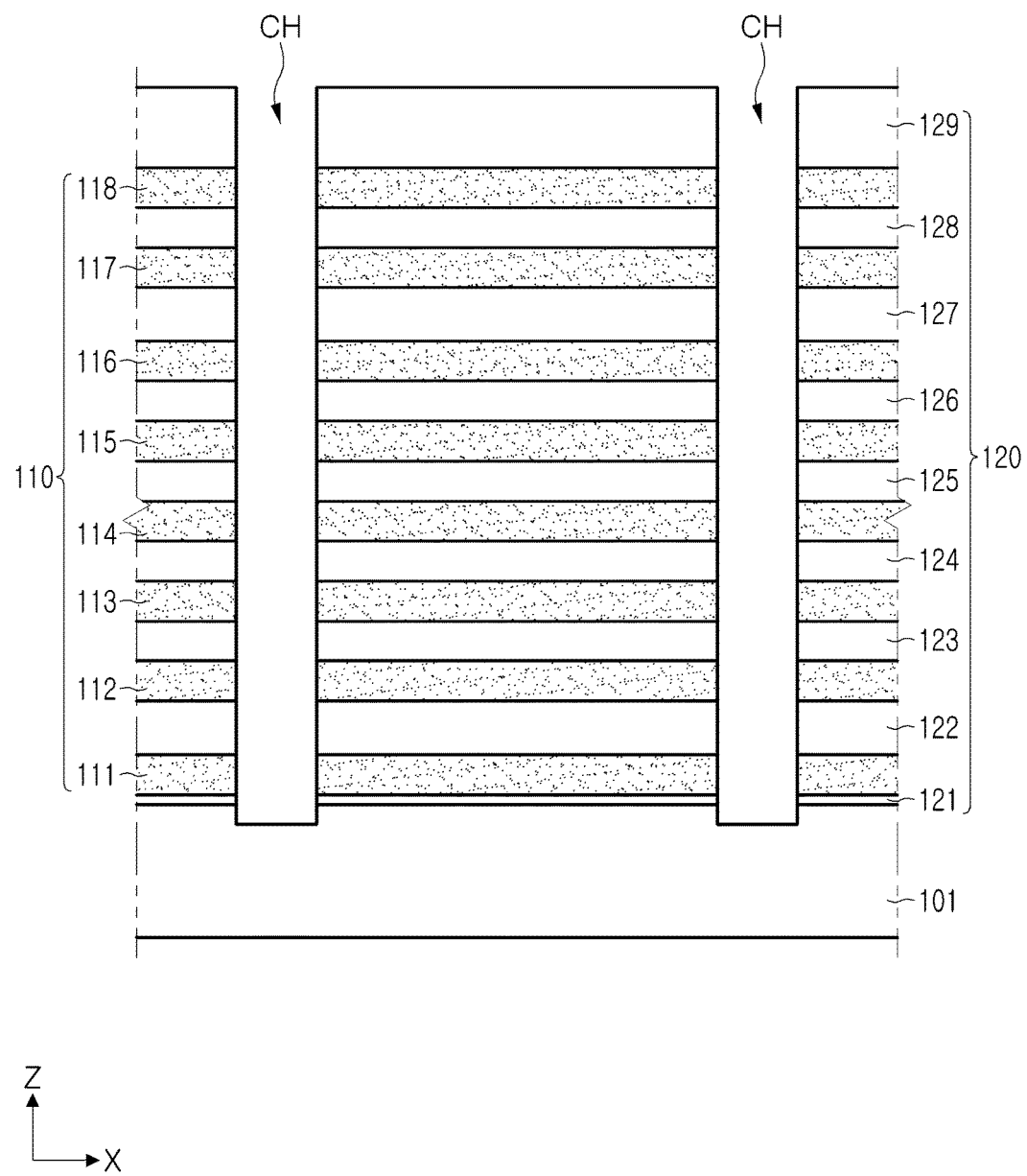
FIGS. 22 to 26 are schematic views illustrating a method of manufacturing a semiconductor device according to an example embodiment.

With reference to FIG. 22, sacrificial layers 110 (e.g., sacrificial layers 111 to 118) and interlayer insulating layers 120 (e.g., interlayer insulating layers 121 to 129) may be alternately stacked on a substrate 101. Channel holes CH having a hole form may be formed. The channel holes CH may penetrate through the sacrificial layers 110 (e.g., sacrificial layers 111 to 118) and the interlayer insulating layers 120 (e.g., interlayer insulating layers 121 to 129).

The channel holes CH may be extended to the substrate 101 in a Z direction, and a recessed region may be formed in the substrate 101. For example, a bottom surface of the channel holes CH may be below a top surface of the substrate 101.

Figure 23:
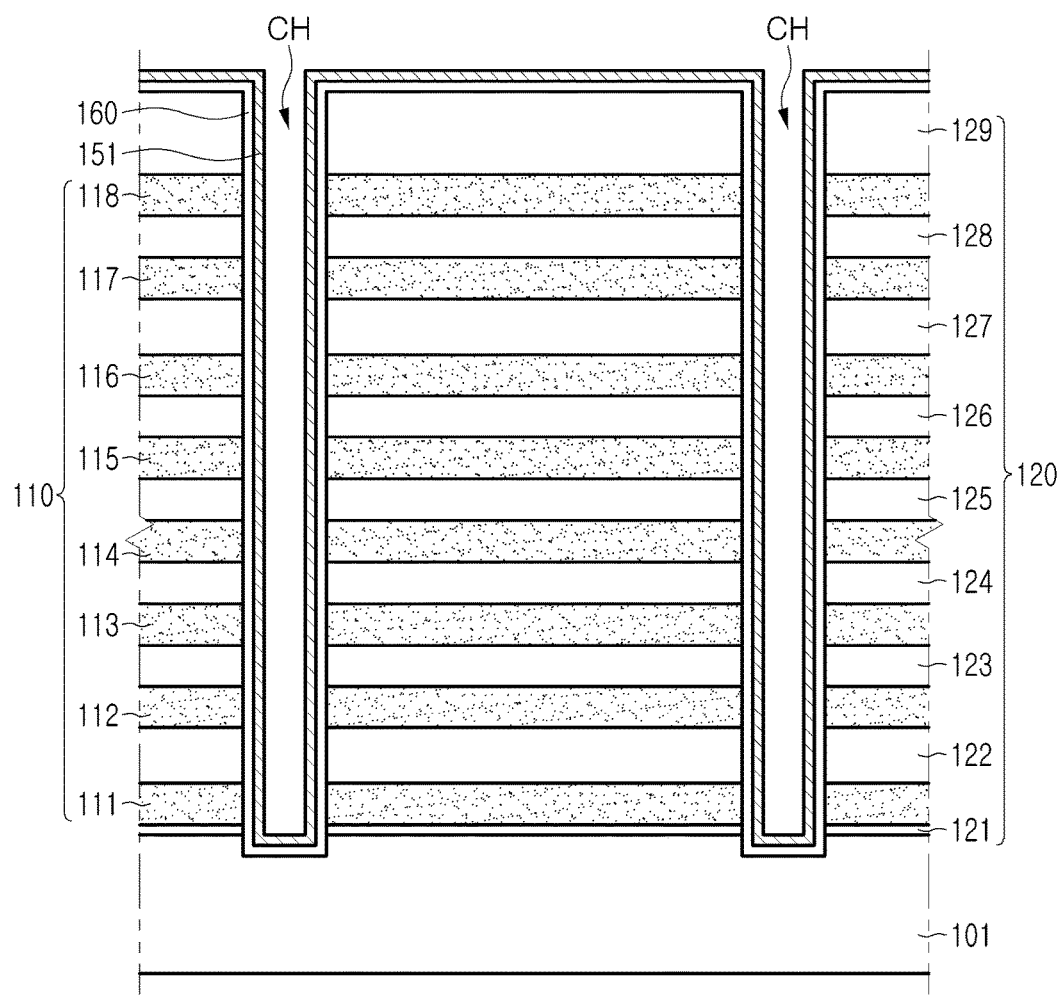

With reference to FIG. 23, a gate dielectric layer 160 and a sacrificial semiconductor layer 151 may be formed in the channel holes CH, and above the sacrificial layers 110 and the interlayer insulating layers 120.

The gate dielectric layer 160 may be formed to have a uniform thickness on a side wall of the channel holes CH, a top surface of the substrate 101 exposed in the channel holes CH, and a top surface of an uppermost one of the interlayer insulating layers 120 (e.g., interlayer insulating layer 129). A bottom surface of the gate dielectric layer 160 may be disposed to be lower than the top surface of the substrate 101.

A sacrificial semiconductor film 151 may be formed to have a uniform thickness on the gate dielectric layer 160. The sacrificial semiconductor film 151 may include a semiconductor material, such as polycrystalline silicon and amorphous silicon.

Figure 24:
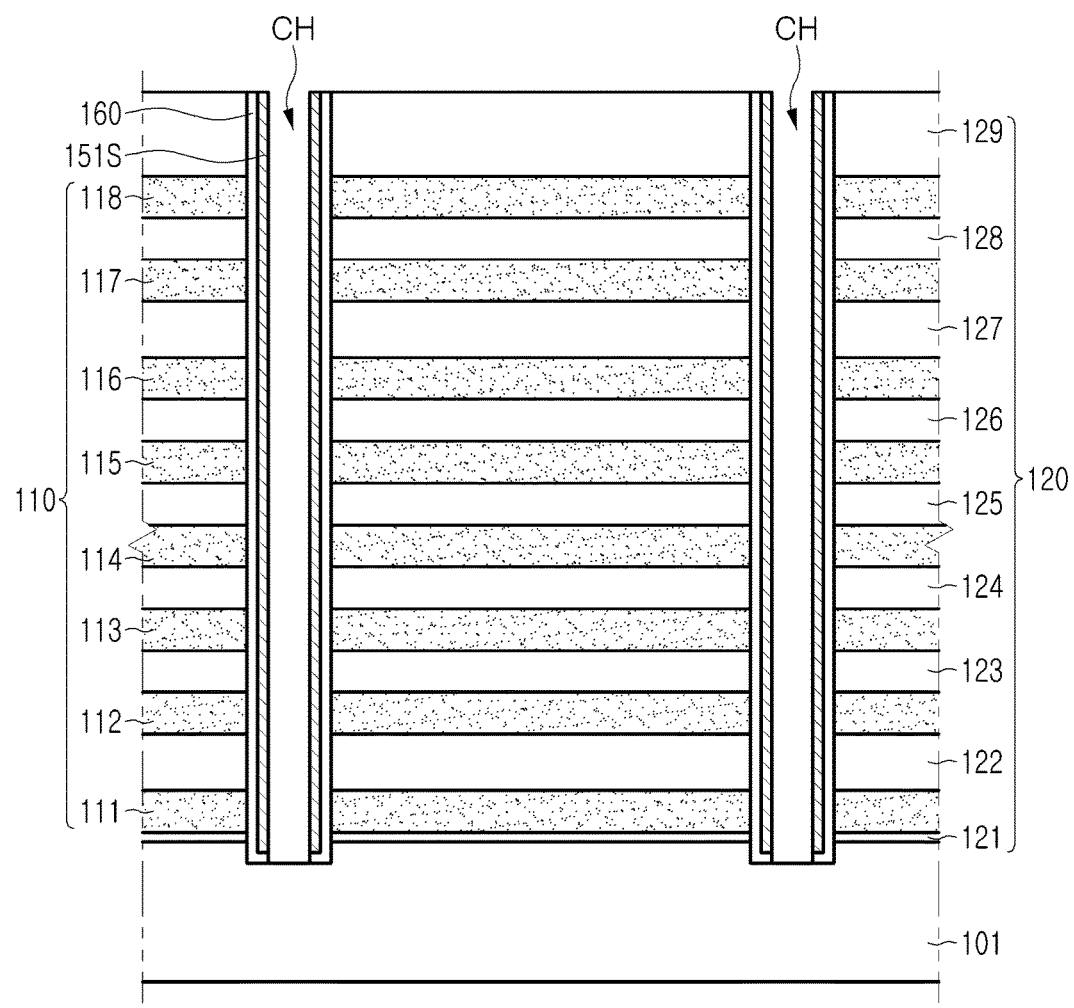

With reference to FIG. 24, in a subsequent process, in order to allow a channel layer 152 to be in direct contact with the substrate 101, a portion of the gate dielectric layer 160 may be removed from the channel holes CH.

A sacrificial spacer layer 151S may be formed on a side wall of the gate dielectric layer 160 through an anisotropic etching process of the sacrificial semiconductor film 151. Subsequently, the gate dielectric layer 160 may be selectively removed in such a manner that the gate dielectric layer 160 is anisotropically etched using the sacrificial spacer layer 151S as an etching mask. The gate dielectric layer 160 may include an L-shaped cross section on the side wall of the channel hole CH.

Figure 25:
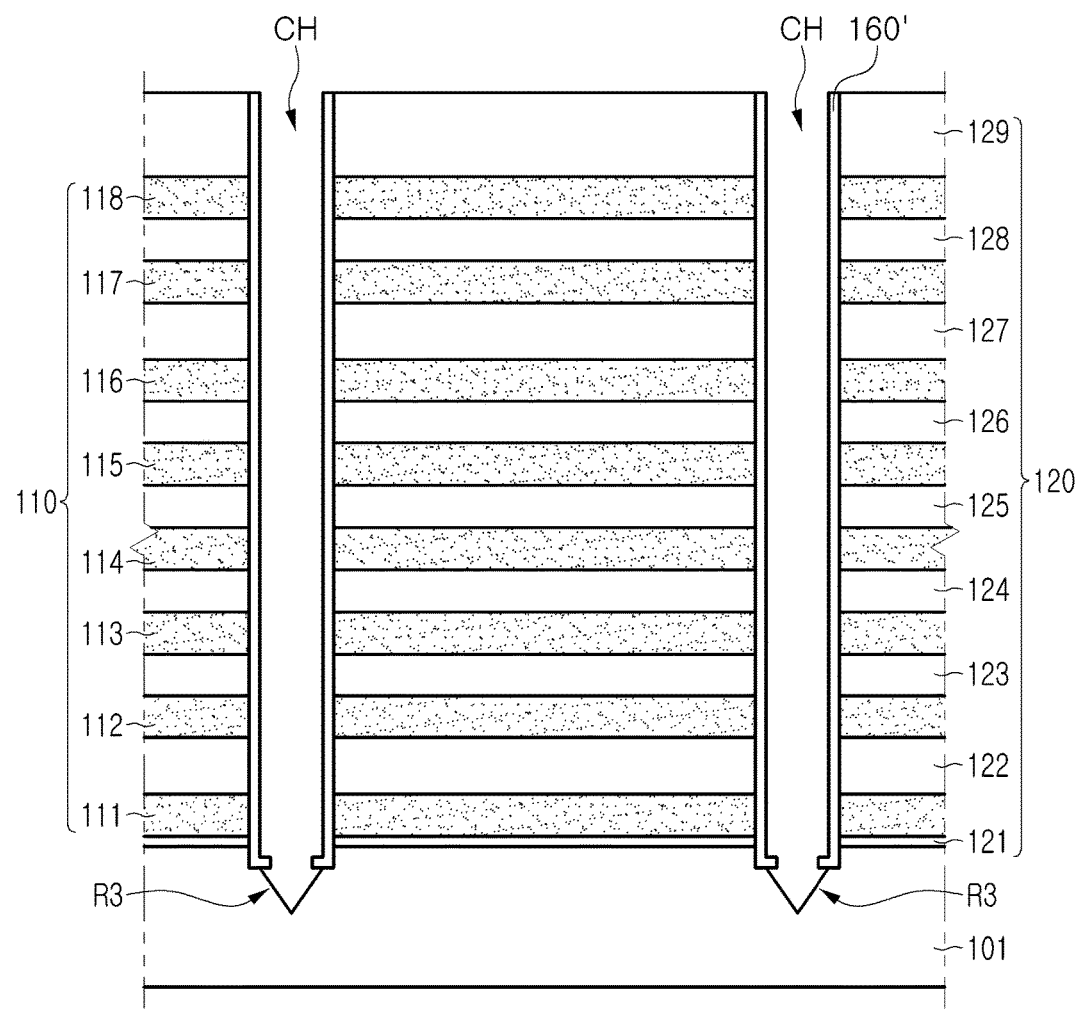

With reference to FIG. 25, the sacrificial spacer layer 151S may be removed, and a recessed region R3 may be formed in an upper portion of the substrate 101.

The sacrificial spacer layer 151S may be removed through an anisotropic wet etching process. The sacrificial spacer layer 151S and the substrate 101 may include the same material. In this case, during the anisotropic etching process of the sacrificial spacer layer 151S, the upper portion of the substrate 101 may be etched together with sacrificial spacer layer 151S, and thus the recessed region R3 may be formed. For example, in a case in which an entirety of the sacrificial spacer layer 151S and the substrate 101 includes Si, the anisotropic wet etching process may be performed using an alkaline solution including $NH_4OH$, NaOH, or KOH.

Through the anisotropic wet etching process, the recessed region R3 may be extended below the gate dielectric layer 160, and may include inclined planes tilting at a specific angle with respect to the top surface of the substrate 101. Due to the inclined planes, the recessed region R3 may include a V-shaped cross section as illustrated in FIG. 25. In some embodiments, the recessed region may form a conical or pyramidical shape, having faceted planes. The inclined planes may correspond to {111} crystal planes of a diamond crystal structure. In a case in which the substrate 101 is provided as a (100) silicon substrate, an angle between the inclined planes and the top surface of the substrate 101 may be the same as the angle between a (100) crystal plane and the (111) crystal plane of the diamond crystal structure.

Figure 26:
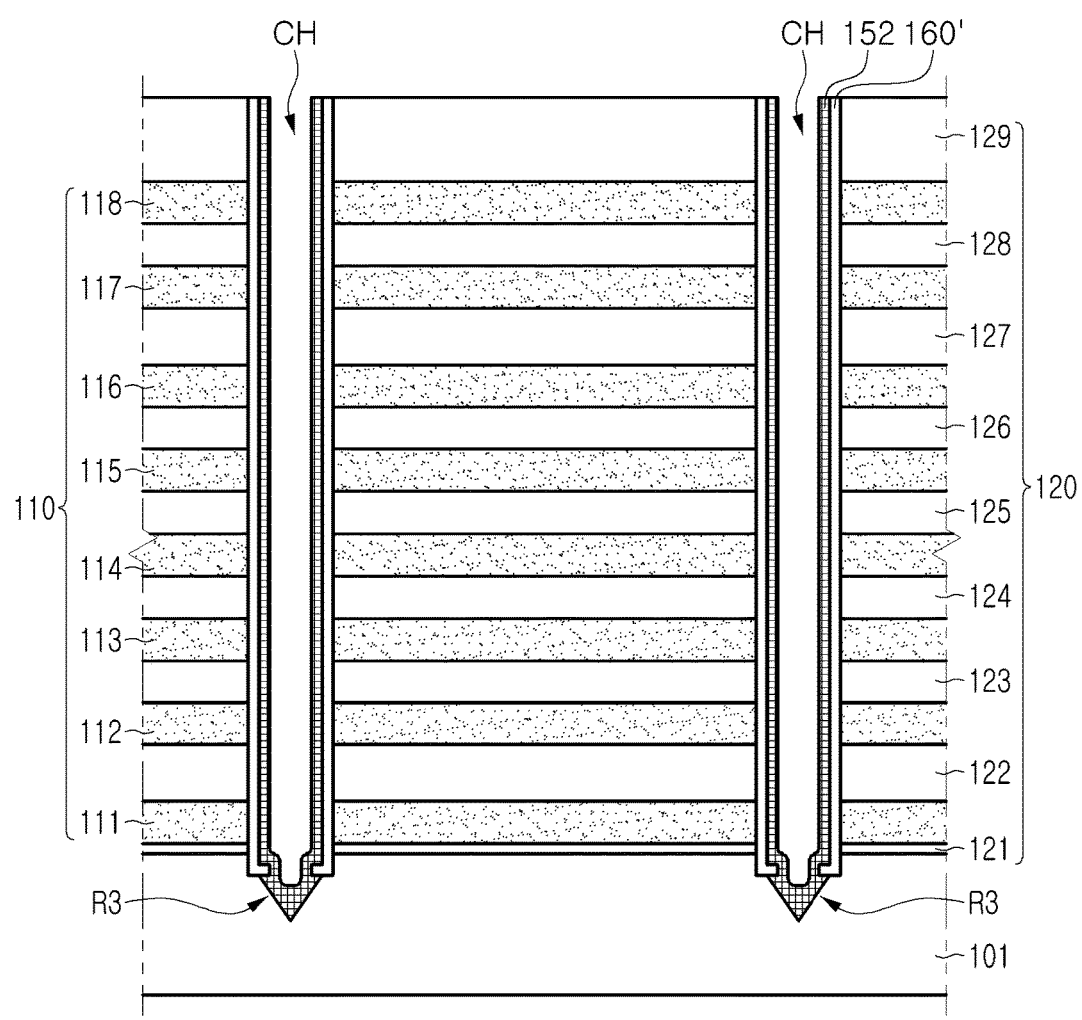

With reference to FIG. 26, the channel layer 152 may be formed in the channel holes CH. Although not illustrated in FIG. 26, the channel layer 152 may be formed on the interlayer insulating layer 129.

The channel layer 152 may include the semiconductor material, such as polycrystalline silicon and amorphous silicon.

The channel layer 152 may be formed to allow the recessed region R3 of the substrate 101 to be filled. In a case in which the channel layer 152 includes polycrystalline silicon, in order to prevent the channel layer 152 from being cut off or removed, the channel layer 152 may be formed to be thicker than a final thickness, and the thickness thereof may be adjusted to have a required final thickness through a trimming process. The trimming process may be accurately performed using a solution, such as an SC1 solution. The SC1 solution refers to a mixture solution including deionized water, $NH_4OH$, and $H_2O_2$ in a ratio of 5:1:1.

Subsequently, a semiconductor device 100A may be manufactured in such a manner that processes described with reference to FIGS. 14 to 18 are performed.

Figure 27:
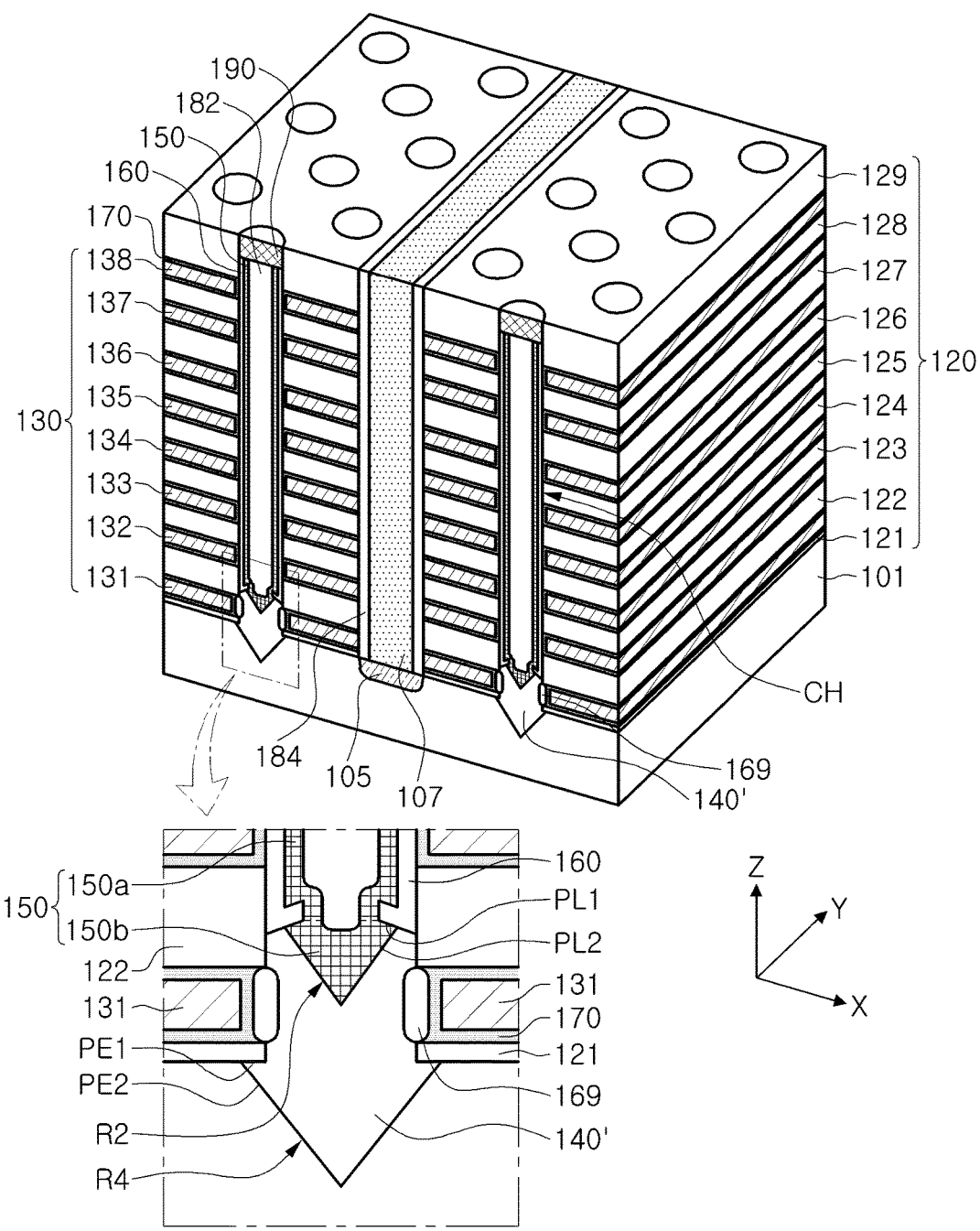
FIG. 27 is a schematic perspective view of a semiconductor device according to an example embodiment.

FIG. 27 is a schematic perspective view illustrating memory cell strings of a semiconductor device according to an example embodiment.

With reference to FIG. 27, a semiconductor device 100C may include a substrate 101, a plurality of channel layers 150 disposed in a direction perpendicular to a top surface of the substrate 101 along an inner side wall of each channel hole CH, and a plurality of interlayer insulating layers 120 and a plurality of gate electrodes 130 stacked along an outside side wall of the channel layers 150. In addition, the semiconductor device 100C may further include epitaxial layers 140' disposed between the channel layers 150 and the substrate 101, a gate dielectric layer 160 disposed between a channel layer 150 and a gate electrode 130, a conductive layer 107 disposed between the second insulating layers 184, and a conductive pad 190 disposed in an upper portion of the channel layers 150.

Compared with a semiconductor device 100 described with reference to FIGS. 3 and 4, the semiconductor device 100C may include an epitaxial layer 140' having a different form, disposed between the channel layer 150 and the substrate 101. Therefore, only changed descriptions will be provided below.

Respective channel layers 150 may include a vertically-provided portion 150a having a pipe or macaroni shape and extended in a direction perpendicular to the top surface of the substrate 101 (e.g., in a Z direction), and a connection portion 150b connected to a lower or end portion of the vertically-provided portion 150a.

A first plane PL1 and a second plane PL2 of the connection portion 150b may meet below the gate dielectric layer 160. In addition, the first plane PL1 may be provided as an interface at which the connection portion 150b is in contact with a portion of a bottom surface of the gate dielectric layer 160, and may be formed on the same plane as the bottom surface of the gate dielectric layer 160.

The epitaxial layer 140' may be disposed between the channel layer 150 and the substrate 101, and may be in contact with the channel layer 150 and the substrate 101. The channel layer 150 may be electrically connected to the substrate 101 through the epitaxial layer 140'. The epitaxial layer 140' may be disposed on a recessed region R4 of the substrate 101. The epitaxial layer 140' may fill the recessed region R4, and may be extended above the top surface of the substrate 101. For example, a top surface of the epitaxial layer 140' may be higher than that of a gate electrode 131 disposed in a bottom portion of gate electrodes 130, and may be lower than a bottom surface of a gate electrode 132.

The epitaxial layer 140' may include a recessed region R2 in contact with the connection portion 150b of the channel layer 150. The epitaxial layer 140' may include a first plane PE1 extended from the top surface of the substrate 101 and a second plane PE2 inclined with respect to the top surface of the substrate 101.

An angle between the second plane PE2 of the epitaxial layer 140' and the top surface of the substrate 101 may be substantially the same as the angle between a (100) crystal plane and a (111) crystal plane of a diamond crystal structure. The second plane PE2 of the epitaxial layer 140' may be provided as the interface at which the epitaxial layer 140' is in contact with the substrate 101.

Figure 28:
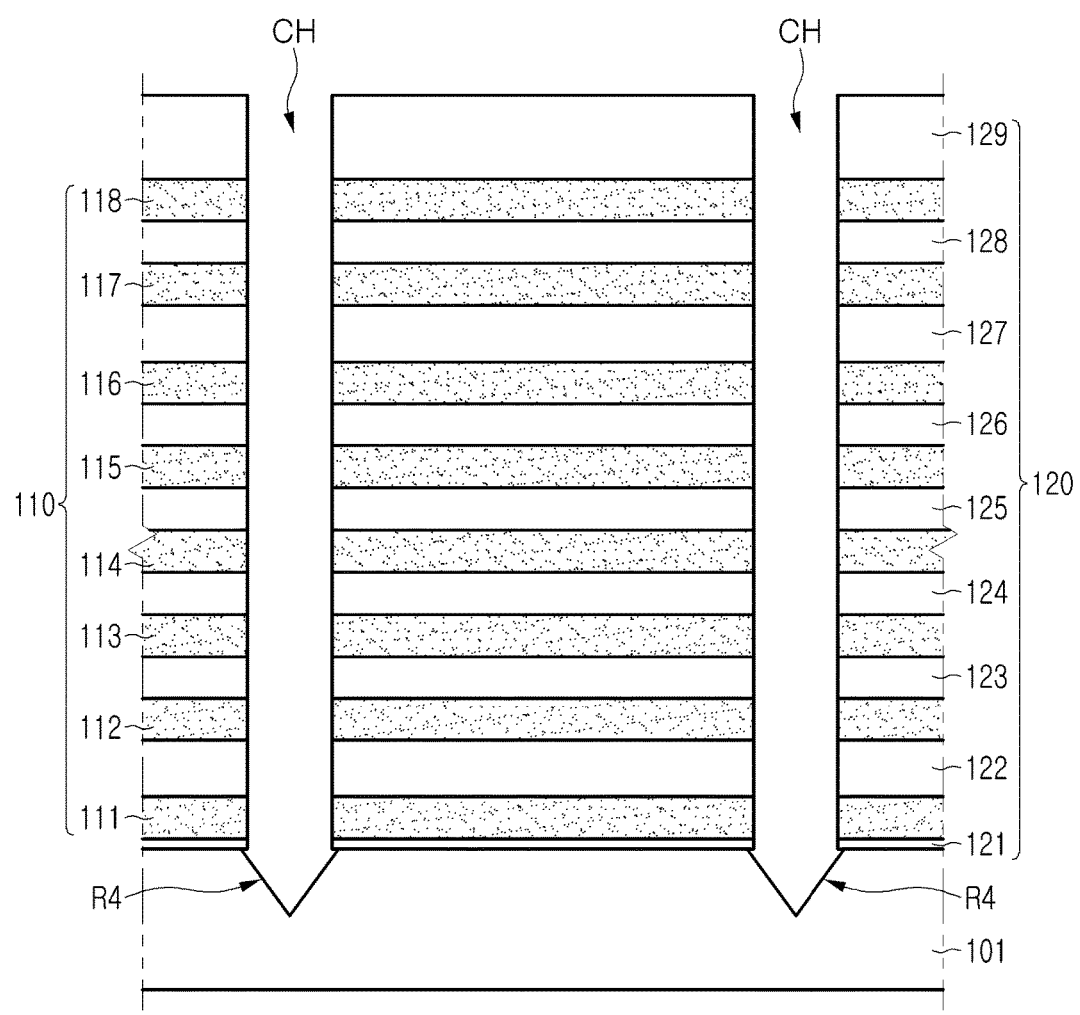
FIGS. 28 to 29 are schematic views illustrating a method of manufacturing a semiconductor device according to an example embodiment.
Figure 29:
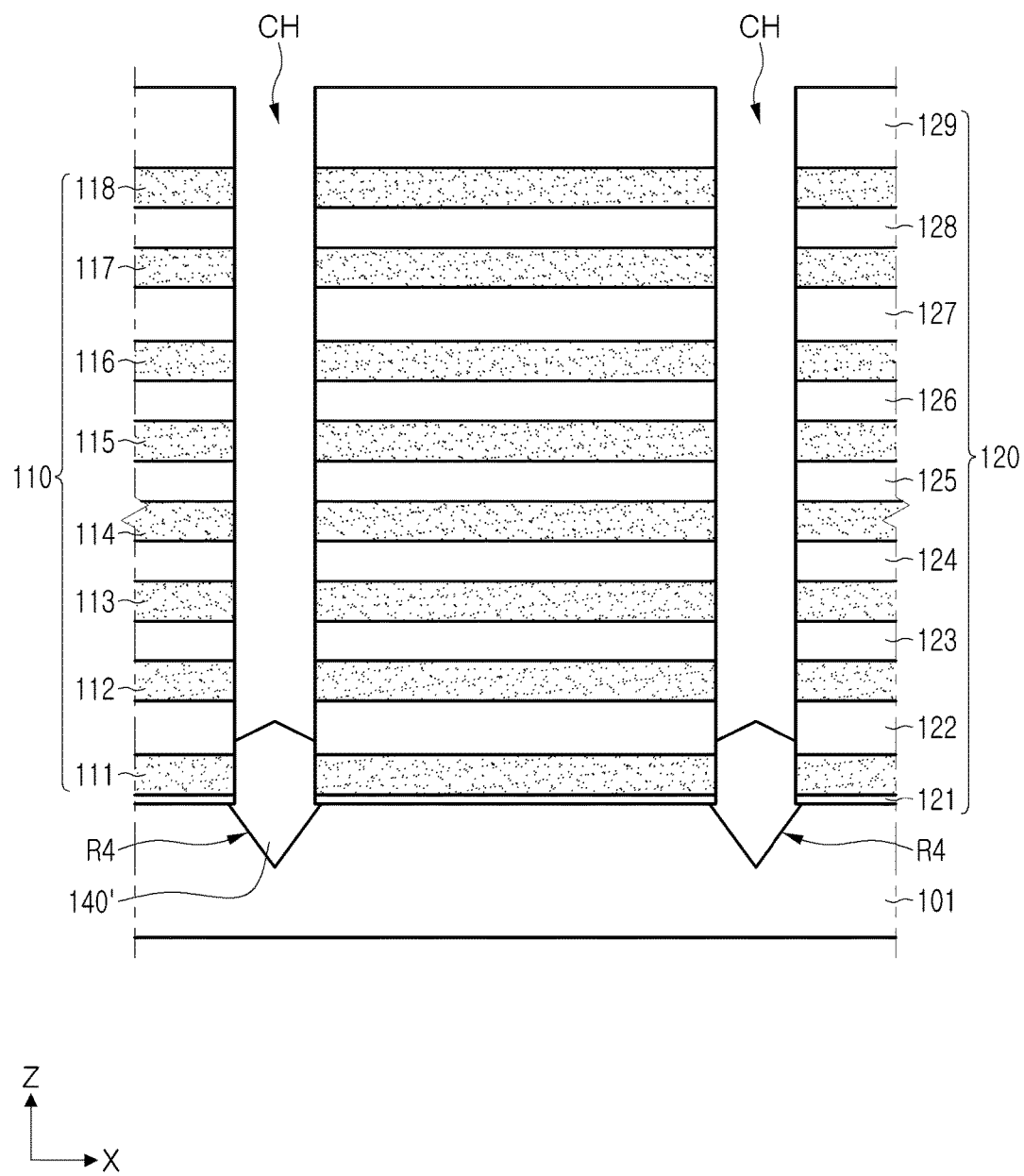

FIGS. 28 to 29 are schematic views of main operations illustrating a method of manufacturing a semiconductor device according to an example embodiment. Hereinafter, descriptions different from the example embodiments described above with reference to FIGS. 7 to 18 will be provided.

With reference to FIG. 28, sacrificial layers 110 (e.g., sacrificial layers 111 to 118) and interlayer insulating layers 120 (e.g., interlayer insulating layers 121 to 129) may be alternately stacked on a substrate 101. Channel holes CH penetrating through the sacrificial layers 110 (e.g., sacrificial layers 111 to 118) and the interlayer insulating layers 120 (e.g., interlayer insulating layers 121 to 129) to be extended to the substrate 101 may be formed.

The channel holes CH are first formed in such a manner that the sacrificial layers 110 (e.g., sacrificial layers 111 to 118) and the interlayer insulating layers 120 (e.g., interlayer insulating layers 121 to 129) are anisotropically etched, and the substrate 101 exposed in the channel holes CH may be further removed through an anisotropic wet etching process. In a case in which the substrate 101 includes silicon single crystal, the anisotropic wet etching process may be performed using an alkaline solution including $NH_4OH$, NaOH, or KOH.

When the anisotropic wet etching process is completed, the channel holes CH may extend to the substrate 101 in a Z direction, so that a recessed region R4 may be formed in the substrate 101. In a case in which the substrate 101 includes silicon single crystal, inclined planes of the recessed region R4 may be provided as crystal planes.

With reference to FIG. 29, an epitaxial layer 140' may be formed on the recessed region R4 in a lower portion of the channel holes CH.

The epitaxial layer 140' may be formed in such a manner that a selective epitaxial growth (SEG) process is performed using the substrate 101 in the recessed region R4 as a seed. The epitaxial layer 140' may be formed to have a single layer structure or a multilayer structure including different growth conditions or compositions.

The epitaxial layer 140' may be doped with an impurity. The impurity may be provided as a conductive impurity the same as that in the substrate 101 or the opposite thereto.

A top surface of the epitaxial layer 140' may be formed to be higher than that of a sacrificial layer 111 disposed adjacently to the substrate 101. In addition, the top surface of the epitaxial layer 140' may be formed to have a convex shape in an opposite direction to the substrate 101. For example, the top surface of the epitaxial layer 140' may have a conical or pyramidical shape pointing away from a top surface of the substrate 101 (e.g., in the Z direction). However, in some embodiments, the top surface of the epitaxial layer 140' may be formed to have a flat shape, depending on a growth condition, or the like.

Subsequently, a semiconductor device 100C may be manufactured in such a manner that processes described with reference to FIGS. 10 to 18 are performed.

Figure 30:
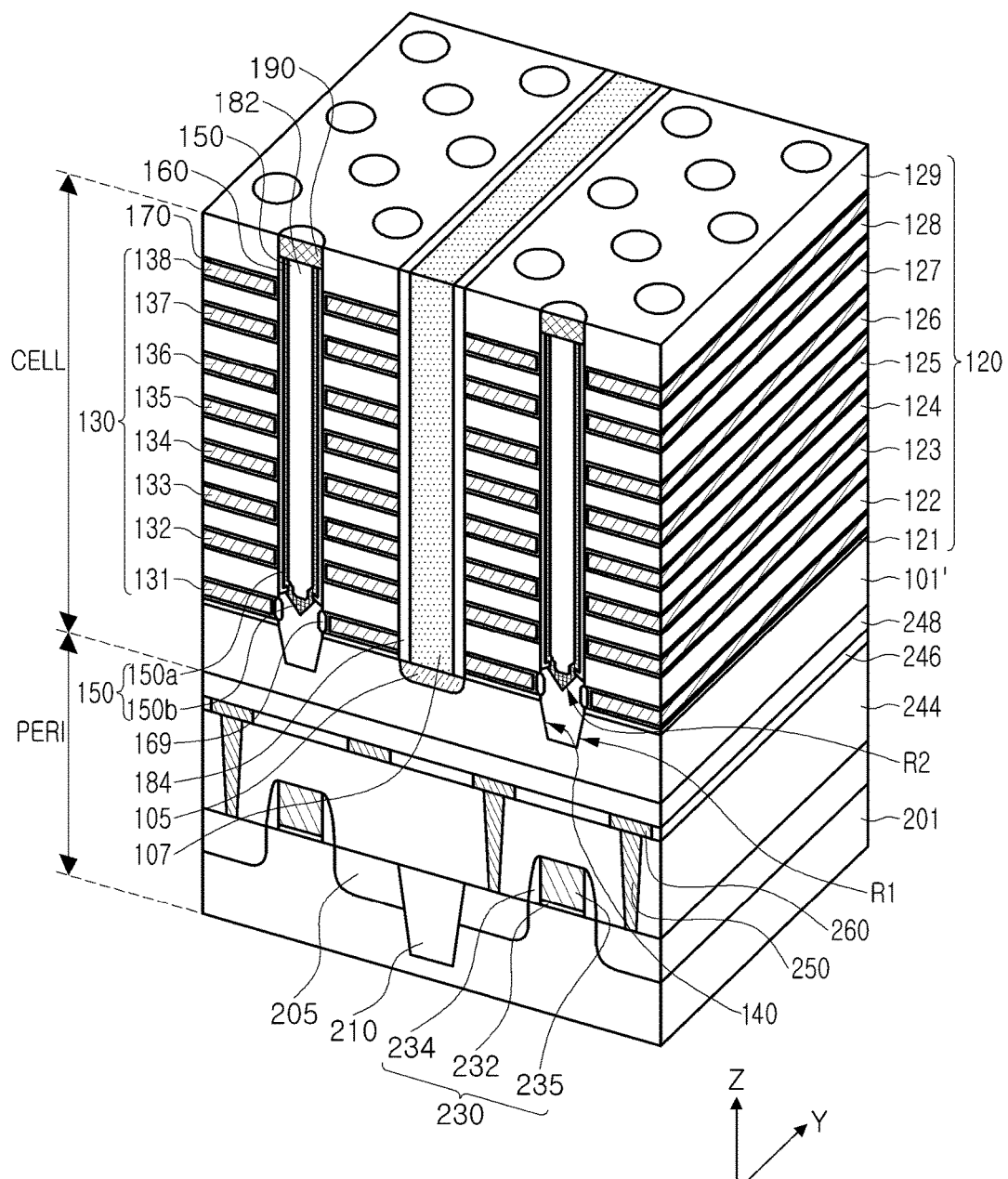
FIG. 30 is a schematic perspective view of a semiconductor device according to an example embodiment.

FIG. 30 is a schematic perspective view of a semiconductor device 100D according to an example embodiment.

With reference to FIG. 30, a semiconductor device 100D may include a cell region CELL and a peripheral circuit region PERI.

The cell region CELL may correspond to a region in which a memory cell array 20 in FIG. 1 is disposed, while the peripheral circuit region PERI may correspond to a region in which a driving circuit 30 of the memory cell array 20 in FIG. 1 is disposed. The cell region CELL may be disposed on the peripheral circuit region PERI. In some embodiments, the cell region CELL may be disposed below the peripheral circuit region PERI.

The cell region CELL may include a substrate 101', a plurality of channel layers 150 disposed in a direction perpendicular to a top surface of the substrate 101', and a plurality of interlayer insulating layers 120 and a plurality of gate electrodes 130, stacked along a side wall of the channel layers 150. In addition, the cell region CELL may further include an epitaxial layer 140 disposed on the substrate 101' in a lower portion of the channel layer 150, a gate dielectric layer 160 disposed between the channel layer 150 and a gate electrode 130, a conductive layer 107 disposed on an impurity region 105, and a conductive pad 190 disposed in an upper portion of the channel layer 150.

In the example embodiment, the cell region CELL is illustrated as having a structure the same as an example embodiment in FIG. 3, but the concept is not limited thereto. The cell region CELL may include a cell region CELL according to various disclosed embodiments, as described herein.

The peripheral circuit region PERI may include a base substrate 201, and circuit devices 230, contact plugs 250, and wiring lines 260 disposed on the base substrate 201.

The base substrate 201 may include a top surface extended in the X and Y directions. The base substrate 201 may include an active region defined by a device isolation layer 210. In a portion of the active region, a doped region 205 including an impurity may be disposed. The base substrate 201 may include a semiconductor material, such as a group IV semiconductor, a group III-V compound semiconductor, or a group II-VI compound semiconductor. For example, the group IV semiconductor may include Si, Ge, or SiGe. The base substrate 201 may be provided as a bulk wafer or an epitaxial layer.

A circuit device 230 may include various types of a field effect transistor. Respective circuit devices 230 may include a circuit gate insulating layer 232, a spacer layer 234, and a circuit gate electrode 235. The doped region 205 may be disposed in the base substrate 201 on two sides of the circuit gate electrode 235 to act as a source region or a drain region of the circuit device 230.

A plurality of peripheral region insulating layers 244, 246, and 248 may be disposed on the circuit device 230 on the base substrate 201. A peripheral region insulating layer 244 may include a high density plasma (HDP) oxide film to efficiently fill space between a plurality of circuit devices 230.

The contact plugs 250 may penetrate through the peripheral region insulating layer 244 to be connected to the doped region 205. An electrical signal may be applied to the circuit device 230 through the contact plugs 250. In a region not illustrated, the contact plugs 250 may be connected to the circuit gate electrode 235. The wiring lines 260 may be connected to the contact plugs 250, and may be disposed to have a multilayer structure in an example embodiment.

The peripheral circuit region PERI may be first manufactured, and the substrate 101' of the cell region CELL is formed in an upper portion thereof, so that the cell region CELL may be manufactured. The substrate 101' may be formed to have a size equal to or smaller than that of the base substrate 201. For example, the area of the substrate 101', as measured in the X and Y directions, may be smaller than the area of the base substrate 201. The substrate 101' may be formed of polycrystalline silicon, or may be formed of amorphous silicon to be crystallized.

The cell region CELL and the peripheral circuit region PERI may be connected in the region not illustrated. For example, an end portion of the gate electrode 130 in a Y direction may be electrically connected to the circuit device 230.

Since the cell region CELL and the peripheral circuit region PERI may be disposed in an upper portion and in a lower portion, respectively, the semiconductor device 100D in the example embodiment may be provided as a miniaturized device.

Figure 31:
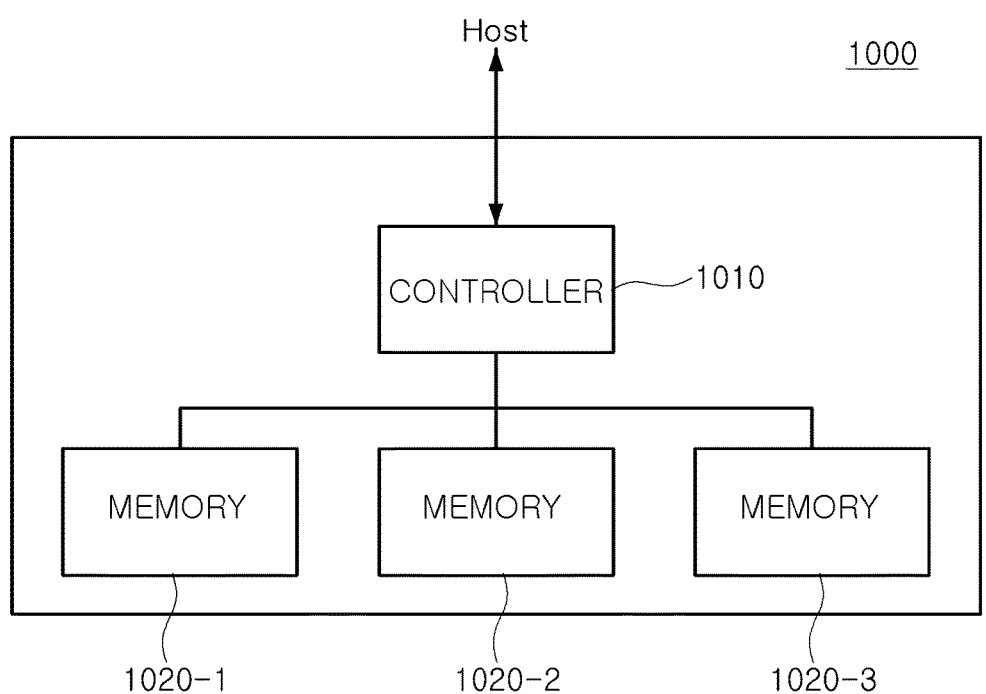
FIG. 31 is a block diagram of a storage device including a semiconductor device according to an example embodiment.

FIG. 31 is a block diagram of a storage device including a semiconductor device according to an example embodiment.

With reference to FIG. 31, according to the example embodiment, a storage device 1000 may include a controller 1010 communicating with a host and memories 1020-1, 1020-2, and 1020-3 storing data. Respective memories 1020-1, 1020-2, and 1020-3 may include the semiconductor devices 100A, 100B, 100C, and 100D, according to various example embodiments described above. Each of memories 1020-1, 1020-2, and 1020-3 may include, respectively, the same or different ones of the semiconductor devices 100A, 100B, 100C, and 100D.

The host communicating with the controller 1010 may be provided as various electronic devices equipped with the storage device 1000, such as, for example, a smartphone, a digital camera, a desktop computer, a laptop computer, a portable media player, or the like. The controller 1010 may generate a command (CMD) to store data in the memories 1020-1, 1020-2, and 1020-3 and/or to output data therefrom after receiving requests for data writing or reading sent by the host.

As illustrated in FIG. 31, one or more memories 1020-1, 1020-2, and 1020-3 may be connected to the controller 1010 in parallel in the storage device 1000. In some embodiments, the storage device 1000 having a large capacity, such as a solid state drive (SSD) may be implemented in such a manner that a plurality of memories 1020-1, 1020-2, and 1020-3 are connected to the controller 1010 in parallel.

Figure 32:
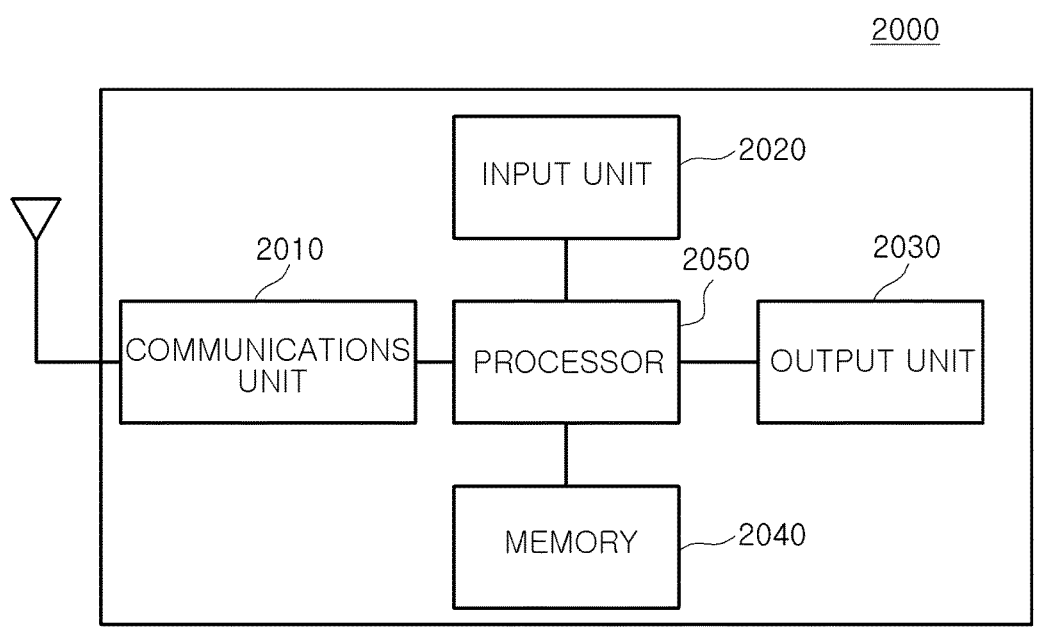
FIG. 32 is a block diagram of an electronic device including a semiconductor device according to an example embodiment.

FIG. 32 is a block diagram of an electronic device including a semiconductor device according to an example embodiment.

With reference to FIG. 32, according to the example embodiment, an electronic device 2000 may include a communications unit 2010, an input unit 2020, an output unit 2030, a memory 2040, and a processor 2050.

The communications unit 2010 may include a wired/wireless communications module, for example, a wireless Internet module, a near field communications module, a global positioning system (GPS) module, a mobile communications module, and the like. The wired/wireless communications module included in the communications unit 2010 may include circuitry and be configured to transmit and receive data by being connected to external communications networks according to various communications standards.

The input unit 2020 may be a module provided for users to control operations of the electronic device 2000. The input unit 2020 may include circuitry and other electrical and/or mechanical mechanisms, such as, for example, a mechanical switch, a touchscreen, a voice recognition module, and the like. In addition, the input unit 2020 may also include a finger mouse device or a mouse operated using a trackball, a laser pointer, or the like. The input unit 2020 may further include various sensor modules by which users may input data.

The output unit 2030 may output information processed in the electronic device 2000 in a form of audio or video, while the memory 2040 may store a program, data, or the like, to process and control the processor 2050. The memory 2040 may include one or more semiconductor devices according to various example embodiments described above, while the processor 2050 may store as well as output data by sending a command to the memory 2040 according to required operations.

The memory 2040 may communicate with the processor 2050 through an interface embedded in the electronic device 2000 or a separate interface. In a case in which the memory 2040 communicates with the processor 2050 through a separate interface, the processor 2050 may store or output data in or from the memory 2040 through various interface standards, such as SD, SDHC, SDXC, MICRO SD, USB, and the like.

The processor 2050 may control operations of respective units included in the electronic device 2000. The processor 2050 may perform control and process operations relating to voice calls, video calls, data communications, and the like, or may perform control and process operations to play and manage multimedia. In addition, the processor 2050 may process inputs sent by a user through the input unit 2020, and may output the results through the output unit 2030. Furthermore, the processor 2050 may store data required to control operations of the electronic device 2000 in the memory 2040 or output the data therefrom. The processor 2050 may be, for example, a central processing unit (CPU).

Figure 33:
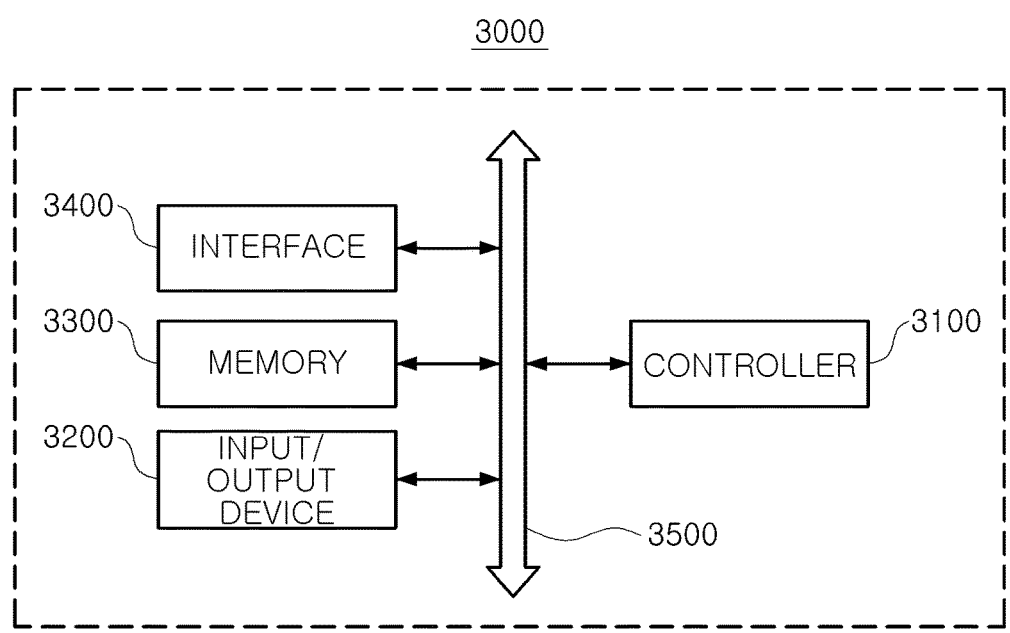
FIG. 33 is a block diagram of an electronic system including a semiconductor device according to an example embodiment.

FIG. 33 is a block diagram of an electronic system including a semiconductor device according to an example embodiment.

With reference to FIG. 33, an electronic system 3000 may include a controller 3100, an input/output device 3200, a memory 3300, and an interface 3400. The electronic system 3000 may be provided as a mobile system or a system transmitting and receiving information. The mobile system may be provided as a personal digital assistant (PDA), a portable computer, a web tablet, a wireless phone, a mobile phone, a digital music player, or a memory card.

The controller 3100 may run a program and control the electronic system 3000. For example, the controller 3100 may be provided as a microprocessor, a digital signal processor, a microcontroller or a device similar thereto.

The input/output device 3200 may be used to input or output data of the electronic system 3000. The electronic system 3000 may be connected to an external device, such as a personal computer or a network to exchange data with the external device, using the input/output device 3200. For example, the input/output device 3200 may be provided as a keypad, a keyboard, or a display.

The memory 3300 may store code and/or data to operate the controller 3100 and/or may store data processed by the controller 3100. The memory 3300 may include the semiconductor device according to various example embodiments described above.

The interface 3400 may be provided as a data transmission channel between the electronic system 3000 and a different external device. The controller 3100, the input/output device 3200, the memory 3300, and the interface 3400 may communicate with each other through a bus 3500.

As set forth above, according to example embodiments, a semiconductor device including transistors having improved properties, configuring a memory cell string, in such a manner that a disconnection phenomenon in a lower portion of a channel layer is resolved, and a thickness of the channel layer is reduced may be provided.

While example embodiments have been shown and described above, it will be apparent to those skilled in the art that modifications and variations could be made without departing from the spirit and scope of the disclosed concepts as defined by the appended claims.

What is claimed is:

1. A semiconductor device, comprising:
gate electrodes stacked on a substrate;
a channel layer penetrating through at least portions of the gate electrodes; and
a gate dielectric layer disposed between the gate electrodes and the channel layer and comprising an opening in a lower portion thereof,
wherein the channel layer comprises a lower portion disposed below the gate dielectric layer and an upper portion disposed on the lower portion, and at least a portion of the lower portion has a width larger than a diameter of the opening.

2. The semiconductor device of claim 1, wherein a width of the lower portion of the channel layer narrows in a direction toward the substrate.

3. The semiconductor device of claim 1, wherein the lower portion of the channel layer comprises a plurality of planes inclined with respect to a top surface of the substrate.

4. The semiconductor device of claim 1, wherein a height from an upper surface of the substrate to a bottom of the lower portion of the channel layer is greater than a height from the upper surface of the substrate to a lower surface of a lowermost gate electrode among the gate electrodes and lower than a height from the upper surface of the substrate to an upper surface of the lowermost gate electrode.

5. The semiconductor device of claim 1, wherein a channel layer is disposed in a channel hole penetrating through the gate electrodes, and
wherein the channel layer comprises a lowest point at the center of the channel hole.

6. The semiconductor device of claim 1, wherein the substrate comprises a recessed region in contact with the lower portion of the channel layer.

7. The semiconductor device of claim 1, wherein a bottom surface of the gate dielectric layer is lower than a top surface of the substrate.

8. The semiconductor device of claim 1, further comprising:
an epitaxial layer disposed between the substrate and the channel layer,
wherein the epitaxial layer comprises a recessed region in contact with the lower portion of the channel layer.

9. The semiconductor device of claim 8, wherein the recessed region comprises a plurality of planes inclined with respect to a top surface of the substrate.

10. A semiconductor device, comprising:
gate electrodes stacked on a substrate; and
a channel layer penetrating through at least portions of the gate electrodes,
wherein a height from an upper surface of the substrate to a bottom of the channel layer is greater than a height from an upper surface of the substrate to a lower surface of a lowermost gate electrode among the gate electrodes and lower than a height from the upper surface of the substrate to an upper surface of the lowermost gate electrode.

11. The semiconductor device of claim 10, wherein the channel layer comprises a lower portion disposed below a gate dielectric layer and the lower portion of the channel layer has a width narrowing in a direction toward the substrate.

12. The semiconductor device of claim 11, wherein the lower portion of the channel layer comprises a plurality of planes inclined with respect to a top surface of the substrate.

13. The semiconductor device of claim 10, further comprising:
a gate dielectric layer disposed between the gate electrodes and the channel layer and comprising an opening in a lower portion thereof,
wherein the channel layer comprises a lower portion disposed below the gate dielectric layer and an upper portion disposed on the lower portion, and the lower portion has a width larger than a diameter of the opening.

14. The semiconductor device of claim 13, further comprising:
an epitaxial layer disposed between the channel layer and the substrate,
wherein the epitaxial layer comprises a recessed region in contact with the lower portion of the channel layer.

15. The semiconductor device of claim 10, wherein a channel layer is disposed in a channel hole penetrating through the gate electrodes, and
wherein the channel layer comprises a lowest point at the center of the channel hole.

16. A semiconductor device, comprising:
gate electrodes stacked on a substrate;
a channel layer disposed in a channel hole penetrating through at least portions of the gate electrodes; and
a gate dielectric layer disposed between the gate electrodes and the channel layer,
wherein the channel layer contacts at least a portion of a bottom surface of the gate dielectric layer, and
wherein the channel layer comprises a lowest point at the center of the channel hole.

17. The semiconductor device of claim 16, wherein the channel layer comprises a plurality of planes inclined with respect to a top surface of the substrate and has a pointed shape toward the substrate.

18. The semiconductor device of claim 16, wherein a height from an upper surface of the substrate to a bottom of the channel layer is higher than a height from the upper surface of the substrate to a lower surface of a lowermost gate electrode among the gate electrodes and lower than a height from the upper surface of the substrate to an upper surface of the lowermost gate electrode.

19. The semiconductor device of claim 16, wherein the gate dielectric layer comprises an opening in a lower portion thereof, and
   wherein the channel layer comprises a lower portion disposed below the gate dielectric layer and an upper portion disposed on the lower portion, and the lower portion has a width larger than a diameter of the opening.

20. The semiconductor device of claim 16, further comprising:
   an epitaxial layer disposed between the substrate and the channel layer,
   wherein the epitaxial layer comprises a recessed region in contact with a lower portion of the channel layer.

* * * * *